United States Patent
Kim et al.

(10) Patent No.: US 10,833,251 B2
(45) Date of Patent: Nov. 10, 2020

(54) COMPOSITION FOR CLEANING MAGNETIC PATTERNS

(71) Applicant: SAMSUNG ELECTRONICS CO., LTD., Suwon-si, Gyeonggi-do (KR)

(72) Inventors: Ho-Young Kim, Hwaseong-si (KR); Jin-Hye Bae, Suwon-si (KR); Hoon Han, Anyang-si (KR); Won-Jun Lee, Seoul (KR); Chang-Kyu Lee, Hwaseong-si (KR); Geun-Joo Baek, Cheonan-si (KR); Jung-Ig Jeon, Cheonan-si (KR)

(73) Assignees: SAMSUNG ELECTRONICS CO., LTD., Suwon-si (KR); SAMYOUNG PURE CHEMICALS CO., LTD., Cheonan-si (KR)

( * ) Notice: Subject to any disclaimer, the term of this patent is extended or adjusted under 35 U.S.C. 154(b) by 160 days.

(21) Appl. No.: 16/108,316

(22) Filed: Aug. 22, 2018

(65) Prior Publication Data

US 2018/0358544 A1  Dec. 13, 2018

Related U.S. Application Data

(62) Division of application No. 15/259,198, filed on Sep. 8, 2016, now Pat. No. 10,062,837.

(30) Foreign Application Priority Data

Nov. 25, 2015  (KR) .................. 10-2015-0165120

(51) Int. Cl.
| | | |
|---|---|---|
| *C11D 7/50* | (2006.01) | |
| *H01L 43/08* | (2006.01) | |
| *G11C 11/16* | (2006.01) | |
| *H01L 27/22* | (2006.01) | |
| *H01L 43/02* | (2006.01) | |

(Continued)

(52) U.S. Cl.
CPC ............ *H01L 43/08* (2013.01); *G11C 11/161* (2013.01); *H01L 27/228* (2013.01); *H01L 43/02* (2013.01); *H01L 43/10* (2013.01); *H01L 43/12* (2013.01)

(58) Field of Classification Search
CPC .................................. C11D 11/0047
USPC ........................................... 510/175
See application file for complete search history.

(56) References Cited

U.S. PATENT DOCUMENTS

| | | | |
|---|---|---|---|
| 6,531,436 B1 * | 3/2003 | Sahbari | C11D 3/0073 134/2 |
| 7,135,445 B2 * | 11/2006 | Charm | C11D 7/3218 510/175 |
| 7,368,299 B2 | 5/2008 | Lee et al. | |

(Continued)

FOREIGN PATENT DOCUMENTS

| | | |
|---|---|---|
| JP | 5711150 B2 | 4/2015 |
| KR | 10-2009-0021429 A | 3/2009 |

(Continued)

*Primary Examiner* — Gregory E Webb
(74) *Attorney, Agent, or Firm* — Lee IP Law, P.C.

(57) ABSTRACT

A composition for cleaning a magnetic pattern, a method of manufacturing a magnetic memory device, a method of forming a magnetic pattern, and a magnetic memory device, the composition including a glycol ether-based organic solvent; a decomposing agent that includes an aliphatic amine; and at least one of a chelating agent, or a cleaning accelerator that includes an organic alkaline compound, wherein the composition is devoid of water.

20 Claims, 17 Drawing Sheets

(51) Int. Cl.
    *H01L 43/10*     (2006.01)
    *H01L 43/12*     (2006.01)

(56) References Cited

U.S. PATENT DOCUMENTS

| | | | |
|---|---|---|---|
| 7,799,749 B2 * | 9/2010 | Kane | C11D 7/5009 |
| | | | 510/175 |
| 8,110,535 B2 | 2/2012 | Egbe | |
| 8,211,845 B2 | 7/2012 | Tanaka et al. | |
| 8,334,213 B2 | 12/2012 | Mao | |
| 8,951,948 B2 * | 2/2015 | Rath | G03F 7/423 |
| | | | 510/175 |
| 2007/0135321 A1 * | 6/2007 | Patel | C11D 3/2075 |
| | | | 510/175 |
| 2010/0112728 A1 | 5/2010 | Korzenski et al. | |
| 2011/0117751 A1 * | 5/2011 | Sonthalia | C11D 1/62 |
| | | | 438/753 |
| 2011/0272380 A1 | 11/2011 | Jeong et al. | |
| 2012/0058644 A1 * | 3/2012 | Klipp | G03F 7/425 |
| | | | 438/707 |
| 2013/0045597 A1 | 2/2013 | Kamada et al. | |
| 2013/0165364 A1 | 6/2013 | Doyel et al. | |
| 2014/0357052 A1 | 12/2014 | Ueno et al. | |

FOREIGN PATENT DOCUMENTS

| | | |
|---|---|---|
| KR | 10-2013-0019728 A | 2/2013 |
| KR | 10-2013-0049501 A | 5/2013 |
| KR | 10-2013-0049502 A | 5/2013 |
| KR | 10-2015-0111529 A | 10/2015 |

* cited by examiner

COMPOSITION FOR CLEANING MAGNETIC PATTERNS

CROSS-REFERENCE TO RELATED APPLICATIONS

This is a divisional application based on pending application Ser. No. 15/259,198, filed Sep. 8, 2016, the entire contents of which is hereby incorporated by reference.

Korean Patent Application No. 10-2015-0165120, filed on Nov. 25, 2015, in the Korean Intellectual Property Office, and entitled: "Compositions for Cleaning Magnetic Patterns, Methods of Forming Magnetic Patterns and Methods of Manufacturing Magnetic Memory Devices," is incorporated by reference herein in its entirety.

BACKGROUND

1. Field

Embodiments relate to a composition for cleaning magnetic patterns, a method of forming magnetic patterns, and a method of manufacturing magnetic memory devices.

2. Description of the Related Art

In a fabrication of a magnetic memory device such as an MRAM device, a layer stack structure including a magnetic layer may be etched to form a magnetic tunnel junction (MTJ) structure.

SUMMARY

Embodiments are directed to a composition for cleaning magnetic patterns, a method of forming magnetic patterns, and a method of manufacturing magnetic memory devices.

The embodiments may be realized by providing a composition for cleaning a magnetic pattern, the composition including a glycol ether-based organic solvent; a decomposing agent that includes an aliphatic amine; and at least one of a chelating agent, or a cleaning accelerator that includes an organic alkaline compound, wherein the composition is devoid of water.

The embodiments may be realized by providing a method of manufacturing a magnetic memory device, the method including forming a first magnetic layer, a tunnel barrier layer, a second magnetic layer, and a metal mask sequentially on a substrate; forming a magnetic tunnel junction (MTJ) structure by etching the second magnetic layer, the tunnel barrier layer, and the first magnetic layer using the metal mask; and removing an etching residue from a sidewall of the MTJ structure using a cleaning composition that is devoid of water, wherein the cleaning composition includes a glycol ether-based organic solvent, a decomposing agent that includes an aliphatic amine, and at least one of a chelating agent, or a cleaning accelerator that includes an organic alkaline compound.

The embodiments may be realized by providing a method of forming a magnetic pattern, the method including forming a layer stack structure such that the layer stack structure includes at least one magnetic layer, at least one metal oxide layer, and at least one metal layer; etching the layer stack structure to form a magnetic pattern; removing a metallic etching residue from a sidewall of the magnetic pattern using a cleaning composition that is devoid of water, wherein the cleaning composition includes a glycol ether-based organic solvent, a decomposing agent that includes an aliphatic amine, and at least one of a chelating agent, or a cleaning accelerator that includes an organic alkaline compound, and rinsing an residue of the metallic etching residue or the cleaning composition using an alcohol-based rinse solution.

The embodiments may be realized by providing a method of manufacturing a magnetic memory device, the method including providing a substrate; sequentially forming a first magnetic layer, a tunnel barrier layer, a second magnetic layer, and a metal mask on the substrate; forming a magnetic tunnel junction (MTJ) structure by etching the second magnetic layer, the tunnel barrier layer, and the first magnetic layer using the metal mask; and removing an etching residue from the sidewall of the MTJ structure using a cleaning composition, wherein the cleaning composition consists essentially of a glycol ether-based organic solvent, a decomposing agent that includes an aliphatic amine, and at least one of a chelating agent, or a cleaning accelerator that includes an organic alkaline compound.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
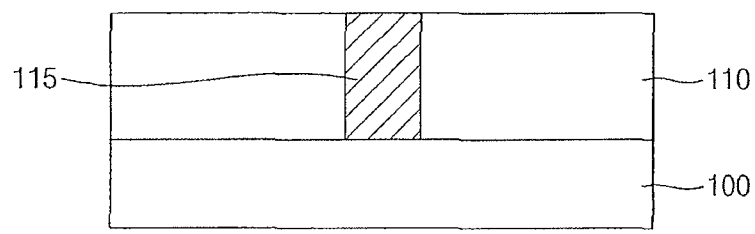
FIGS. 1 to 6 illustrate cross-sectional views of stages in a method of forming a magnetic pattern in accordance with example embodiments.

According to example embodiments, a composition for cleaning magnetic patterns (hereinafter, abbreviated as a cleaning composition) may include, e.g., a glycol ether-based organic solvent and a decomposing agent including an aliphatic amine. In an implementation, the cleaning composition may further include an organic alkaline cleaning accelerator and/or a chelating agent.

The cleaning composition may be used to selectively remove a metallic by-product that may be generated from an etching process with respect to a layer stack structure including a magnetic layer, a metal layer, and an insulation layer. In an implementation, the cleaning composition may be used to decompose and remove a metal complex that may include a combination of a plurality of metal ingredients.

In an implementation, the metal complex may be created by an association or a combination of at least one ferromagnetic metal and at least one non-ferromagnetic metal. For example, the metal complex may include a ternary complex such as tungsten-titanium-cobalt (W—Ti—Co), or a quaternary complex such as tungsten-titanium-cobalt-iron (W—Ti—Co—Fe), or tungsten-titanium-ruthenium-cobalt (W—Ti—Ru—Co). As used herein, the term "or" is not an exclusive term.

In an implementation, the cleaning composition may be substantially devoid of water, e.g., deionized water, and may be provided as an organic-based composition from which a water-based ingredient may be substantially excluded. In an implementation, the cleaning composition may be completely devoid of water.

The glycol ether-based organic solvent may serve as a medium for removing the metallic by-product.

The organic solvent may include, e.g., diethylene glycol monomethyl ether, triethylene glycol monobutyl ether, ethylene glycol monohexyl ether, diethylene glycol monohexyl ether, diethylene glycol monophenyl ether, propylene glycol monomethyl ether, dipropylene glycol monomethyl ether, tripropylene glycol monomethyl ether, dipropylene glycol monopropyl ether, propylene glycol monobutyl ether, or dipropylene glycol monobutyl ether. For example, these may be used alone or in a combination thereof.

A glycol ether-based compound having a suitable polarity for achieving solubility with respect to the metallic by-product, the decomposing agent, the cleaning accelerator, the chelating agent, etc., may be used as the organic solvent. In an implementation, diethylene glycol monomethyl ether and/or dipropylene glycol monomethyl ether may be used as the organic solvent, in consideration of the solubility and the polarity.

In an implementation, the organic solvent may be included in the composition in an amount ranging from about 50 weight percent (wt %) to about 95 wt %, based on a total weight of the cleaning composition. Maintaining the amount of the organic solvent at about 50 wt % or greater may help ensure that the metallic by-product decomposed or dissociated by the decomposing agent is sufficiently dissolved and removed in the cleaning composition. Maintaining the amount of the organic solvent at about 95 wt % or less may help ensure that a sufficient removal capability for the metallic by-product is achieved.

The decomposing agent may include the aliphatic amine. In an implementation, the aliphatic amine may be coordinated with, e.g., each, metal atom included in the metal complex. Accordingly, the metal atoms may be separated or dissociated from the metal complex to be dissolved and removed by the organic solvent.

The decomposing agent may include, e.g., a primary amine, a secondary amine, a tertiary amine, and/or an alkanol amine. In an implementation, the primary amine and/or the alkanol amine may be selected as the decomposing agent for an enhanced solubility with respect to the organic solvent and an interacting force with the metallic by-product.

In an implementation, the decomposing agent may include, e.g., monoethanol amine and/or isopropanol amine. These may be used alone or in a combination thereof.

In an implementation, the decomposing agent may be included in the composition in an amount of about 4 wt % to about 45 wt %, based on the total weight of the cleaning composition. Maintaining the amount of the decomposing agent at about 4 wt % or greater may help ensure that a sufficient interacting force with the metallic by-product is achieved. Maintaining the amount of the decomposing agent at about 45 wt % or less may help reduce the possibility of and/or prevent formation of a solvate with the organic solvent, which could undesirably degrade or interrupt a decomposition of the metallic by-product.

The cleaning accelerator may include a material that may have an etching selectivity with respect to a metallic component. For example, an etching rate for the metallic by-product may be improved by adding the cleaning accelerator to the cleaning composition.

In an implementation, the cleaning accelerator may include an organic alkaline compound, e.g., a quaternary ammonium hydroxide-based or -containing compound. In an implementation, a pH of the cleaning composition may be adjusted by the addition of the organic alkaline compound, so that damage to the layer stack structure (which could otherwise be caused when the cleaning composition is excessively acidic or basic) may be reduced and/or prevented.

In an implementation, the pH of the cleaning composition may be adjusted to be about 7 to about 13, e.g., by the addition of the cleaning accelerator. In an implementation, the pH of the cleaning composition may be adjusted to be about 9 to about 12.5.

In an implementation, a quaternary ammonium hydroxide may be used as the cleaning accelerator. The layer stack structure may be passivated by substitution groups included in the quaternary ammonium hydroxide to help improve a selective etching property for the metallic by-product. In an implementation, the cleaning accelerator may include, e.g., tetramethyl ammonium hydroxide (TMAH) or choline.

In an implementation, the cleaning accelerator may be included in the composition in an amount of about 0.001 wt % to about 5 wt %, based on the total weight of the cleaning composition. Maintaining the amount of the cleaning accelerator at about 0.001 wt % or greater may help ensure that an improvement of an etching rate for the metallic by-product is substantially realized. Maintaining the amount of the cleaning accelerator at about 5 wt % or less may help reduce the possibility of and/or prevent damage to the layer stack structure (including the magnetic layer, the insulation layer, etc.) during removal of the metallic by-product.

The chelating agent may include a compound capable of forming a coordination bond with a metal. The chelating agent may be provided as, e.g., a passivation agent for an etching mask that includes tungsten (W). For example, an adsorption of metallic ingredients from the etching mask to a sidewall of the layer stack structure may be reduced and/or prevented.

The chelating agent may include, e.g., ethylene diamine, diethylene triamine, triethylene tetramine, tetraethylene pentamine, ethylenediamine tetraacetic acid, etc. These may be used alone or in a combination thereof. In an implementation, the chelating agent may include ethylene diamine tetraacetic acid (EDTA).

In an implementation, the chelating agent may be included in the composition in an amount of about 0.001 wt % to about 5 wt %, based on the total weight of the cleaning composition. Maintaining the amount of the chelating agent at about 0.001 wt % or greater may help ensure that a passivation of the etching mask is substantially achieved. Maintaining the amount of the chelating agent at about 5 wt % or less may help reduce the possibility of and/or prevent interruption of the removal or etching of the metallic by-product by the chelating agent.

The cleaning composition according to example embodiments as described above may be efficiently employed for removing an etching residue (e.g., the metallic by-product) after forming a magnetic tunnel junction (MTJ) structure, by etching the layer stack structure that may include the magnetic layer, the metal layer, and the insulation layer. An organic-based cleaning system may be implemented through the cleaning composition that is substantially devoid of water and/or a water-based component, and only the metallic by-product (attached to or on a sidewall of the MTJ structure) may be removed, without causing undesirable damage to the MTJ structure.

FIGS. 1 to 6 illustrate cross-sectional views of stages in a method of forming a magnetic pattern in accordance with example embodiments. For example, the magnetic pattern may include an MTJ structure.

Referring to FIG. 1, an insulating interlayer 110 and a plug 115 may be formed on a substrate 100.

The substrate 100 may include a semiconductor substrate, e.g., a silicon substrate, a germanium substrate, or a silicon-germanium substrate. In an implementation, a silicon-on-insulator (SOI) substrate or a germanium-on-insulator (GOI) substrate may be also used as the substrate 100. In an implementation, the substrate 100 may include a group III-V compound such as InP, GaP, GaAs, or GaSb.

A circuit device including, e.g., a word line, a transistor, a diode, a source/drain layer, a contact, a wiring, etc., may be formed on the substrate 100. In an implementation, a lower insulation layer covering the circuit device may be further formed on the substrate 100.

The insulating interlayer 110 may be formed on the substrate or the lower insulation layer. The insulating interlayer 110 may include a silicon oxide-based material, e.g., a plasma enhanced oxide (PEOX), tetraethyl orthosilicate (TEOS), or flowable oxide (FOX).

The plug 115 may be formed in the insulating interlayer 110, and may be electrically connected to at least a portion of the circuit device.

In an implementation, an opening may be formed through the insulating interlayer 110 to expose a top surface of the substrate 100 or the circuit device. A conductive layer filling the opening may be formed on the insulating interlayer 110. An upper portion of the conductive layer may be planarized by a chemical mechanical polishing (CMP) process until a top surface of the insulating interlayer 110 is exposed to form the plug 115. The conductive layer may be formed of a metal such as tungsten (W), copper (Cu), titanium (Ti), tantalum (Ta), etc., a nitride of the metal and/or doped polysilicon.

Figure 2:
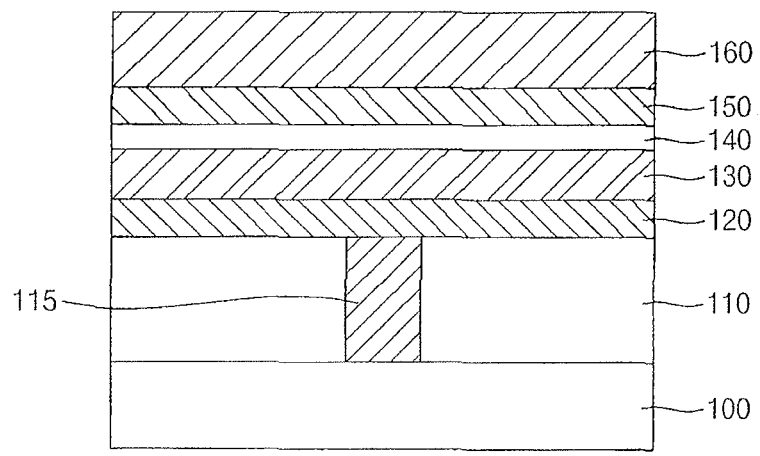

Referring to FIG. 2, a lower barrier conductive layer 120, a pinned layer 130, a tunnel barrier layer 140, a free layer 150, and a metal mask layer 160 may be sequentially formed on the insulating interlayer 110 and the plug 115 to form a layer stack structure.

The lower barrier conductive layer 120 may be formed of a metal or a metal nitride, e.g., titanium, titanium nitride, tantalum, tantalum nitride, or the like.

The pinned layer 130 may be formed of a ferromagnetic metal such as cobalt (Co), iron (Fe), platinum (Pt), manganese (Mn), palladium (Pd), tellurium (Te), chromium (Cr), nickel (Ni), etc., or an alloy thereof. For example, the pinned layer 130 may include a binary alloy or a ternary alloy such as CoPt, FePt, FePd, MnFe, CoCr, CoCrPt, or the like.

In an implementation, a non-magnetic element including, e.g., boron (B), carbon (C), nitrogen (N), oxygen (O), fluorine (F), chlorine (CO, sulfur (S) may be doped in the pinned layer 130. For example, the pinned layer 130 may include a boron-doped alloy such as CoPtB, CoFeB, FePtB, or the like.

In an implementation, the pinned layer 130 may be formed as a stack structure including a lower pinned layer, a spacer, and an upper pinned layer. The spacer may be formed of a synthetic anti-ferromagnetic (SAF) material including, e.g., ruthenium (Ru), iridium (Ir), palladium (Pd), osmium (Os), rhodium (Rh), etc.

The tunnel barrier layer 140 may be formed of an insulative metal oxide. In an implementation, the tunnel barrier layer 140 may include magnesium oxide (MgO) or aluminum oxide (AlO).

The free layer 150 may be formed of the above-mentioned ferromagnetic metal or ferromagnetic alloy. For example, the free layer 150 may include the ferromagnetic alloy substantially the same or similar to that included in the pinned layer 130 such as CoPtB, CoFeB or FePtB.

In an implementation, the arrangement of the pinned layer 130 and the free layer 150 may be reversed.

The metal mask layer 160 may be formed of, e.g., a metal such as tungsten. A thickness of the metal mask layer 160 may be relatively increased in consideration of a subsequent etching process.

The lower barrier conductive layer 120, the pinned layer 130, the tunnel barrier layer 140, the free layer 150, and the metal mask layer 160 may be formed by, e.g., a sputtering process or an atomic layer deposition (ALD) process.

Figure 3:
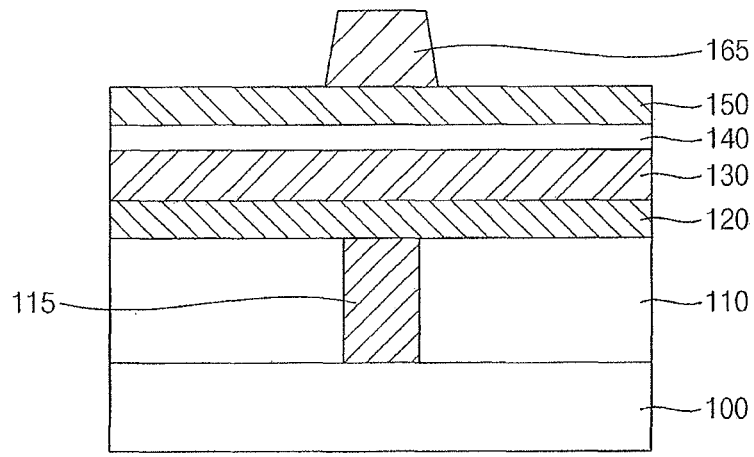

Referring to FIG. 3, the metal mask layer 160 may be patterned to form a metal mask 165. In an implementation, a sidewall of the metal mask 165 may have a tapered profile or a curved profile.

Figure 4:
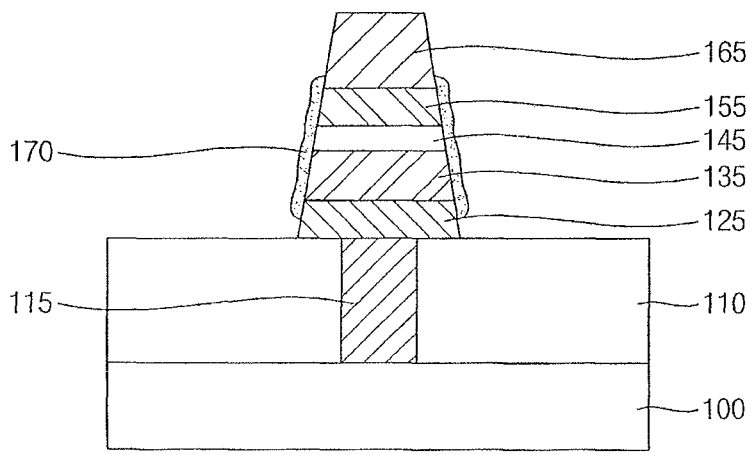

Referring to FIG. 4, a dry etching process may be performed using the metal mask 165 so that a remaining portion of the layer stack structure may be partially etched.

After the etching process, a magnetic pattern including a lower barrier conductive pattern 125, a pinned layer pattern 135, a tunnel barrier pattern 145, a free layer pattern 155, and a metal mask 165 may be formed on the plug 115. The magnetic pattern may include the MTJ structure defined by the pinned layer pattern 135, the tunnel barrier pattern 145, and the free layer pattern 155.

The dry etching process may include, e.g., an ion beam etch (IBE) process or a plasma reactive etching process. An etching residue may be generated from the metal mask 165, the free layer 150, the tunnel barrier layer 140, the pinned layer 130, and/or the lower barrier conductive layer 120 during the dry etching process. Different species of the etching residue may combine to create a metallic by-product 170.

The metallic by-product 170 may include a metal complex from a combination of metallic ingredients detached from the metal mask 165, the free layer 150, the pinned layer 130, and/or the lower barrier conductive layer 120. For example, the metallic by-product 170 may include a ternary complex such as W—Ti—Co, or a quaternary complex such as W—Ti—Co—Fe.

In an implementation, the metallic by-product 170, as illustrated in FIG. 4, may be attached to or on a sidewall of the MTJ structure. In an implementation, the metallic by-product 170 may be also attached to or on sidewalls of the metal mask 165 and/or the lower barrier conductive pattern 125. In an implementation, the metallic by-product 170 may be also attached on the top surface of the insulating interlayer 110.

Figure 5:
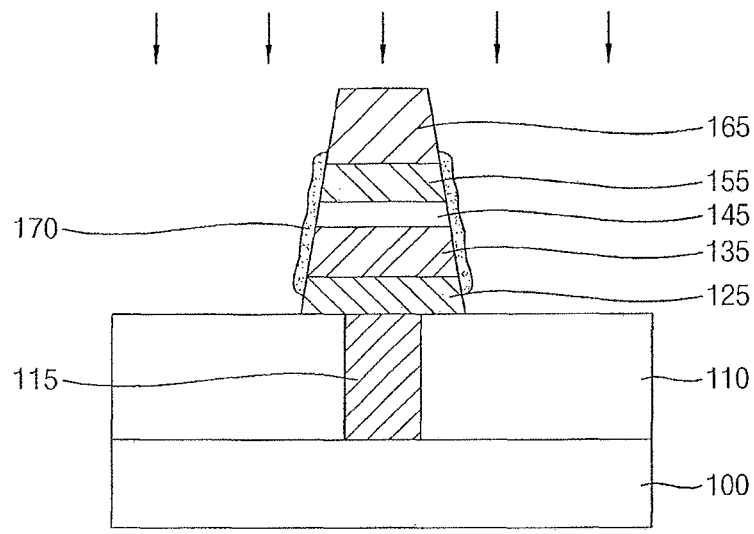

Referring to FIG. 5, a cleaning process may be performed to remove the metallic by-product 170. The cleaning process may be performed using a composition for cleaning magnetic patterns (hereinafter abbreviated as a cleaning composition) in accordance with example embodiments as described above.

As described above, the cleaning composition may include a glycol ether-based organic solvent and a decomposing agent including an aliphatic amine. In an implementation, the cleaning composition may further include an organic alkaline cleaning accelerator and/or a chelating agent.

In an implementation, the organic solvent may include diethylene glycol monomethyl ether and/or dipropylene glycol monomethyl ether.

In an implementation, the decomposing agent may include a primary amine and/or an alkanol amine. For example, the decomposing agent may include monoethanol amine and/or isopropanol amine.

The cleaning accelerator may include an organic alkaline compound, e.g., may include a quaternary ammonium hydroxide such as TMAH or choline. The cleaning accelerator may function as a pH adjusting agent of the cleaning composition. The chelating agent may include EDTA.

In an implementation, the cleaning composition may include about 50 wt % to about 95 wt % of the organic solvent, about 4 wt % to about 45 wt % of the decomposing agent, about 0.001 wt % to about 5 wt % of the cleaning accelerator, and about 0.001 wt % to about 5 wt % of the chelating agent, based on a total weight of the cleaning composition.

As illustrated in FIG. 5, the cleaning composition may be provided on the magnetic pattern that includes the lower barrier conductive pattern 125, the MTJ structure, and the metal mask 165 to contact or be exposed to the metallic by-product 170.

In an implementation, a passivation layer may be formed on a surface of the metal mask 165 including, e.g., tungsten, by the chelating agent included in the cleaning composition. Accordingly, a detachment and a transfer of metallic ingredients from the metal mask 165 to the sidewall of the MTJ structure may be blocked or prevented during the cleaning process.

The decomposing agent included in the cleaning composition may form a coordination bond with the metal complex included in the metallic by-product 170. For example, each metal atom in the metal complex may be surrounded by the decomposing agent including the aliphatic amine so that the metal complex may be decomposed into the individual metal atoms. Accordingly, an assembly may be formed by the metal atom and molecules of the decomposing agent surrounding the metal atom.

The assembly may be solvated by the organic solvent, and the metallic by-product 170 may be removed from a sidewall of the magnetic pattern.

An etching rate with respect to the metallic by-product 170 may be increased by the cleaning accelerator included in the cleaning composition so that a cleaning efficiency may be improved. In an implementation, the pH of the cleaning composition may be adjusted to be about 9 to about 12.5, e.g., by the cleaning accelerator. For example, surface oxidation of the MTJ structure that could otherwise be caused if a strong acidic or strong basic composition were to be used may be avoided.

In a comparative example, if a composition including a water-based component were to be used for removing the metallic by-product 170, surfaces of the tunnel barrier pattern 145, the pinned layer pattern 135, and/or the free layer pattern 155 could be oxidized and damaged (e.g., $MgO+H_2O \rightarrow Mg(OH)_2$, $2Fe_2++4OH \rightarrow 2Fe(OH)_2$). Further, if the strong acidic or strong basic composition were to be used for removing the metallic by-product 170, surfaces of the tunnel barrier pattern 145, the pinned layer pattern 135, and/or the free layer pattern 155 could be damaged by being oxidized or reduced.

The cleaning composition in accordance with example embodiments as described above may be an organic-based composition that is devoid of water or water-based components, e.g., a water-soluble low molecular weight acid. Thus, undesirable formation of salts from the MTJ structure by the water-based components may be avoided. Additionally, the pH of the cleaning composition may be properly adjusted by the cleaning accelerator so that a selective removal of the metallic by-product 170 may be implemented with high efficiency.

Figure 6:
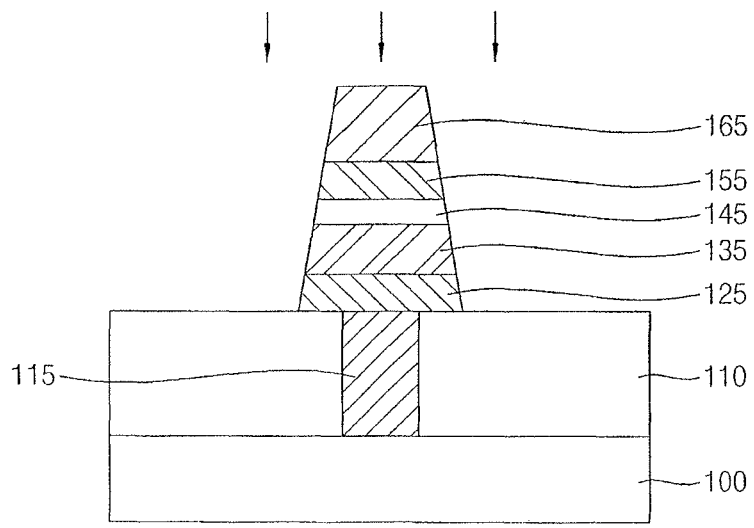

Referring to FIG. 6, after performing the cleaning process, a rinsing process may be further performed. A cleaning residue that may remain on a surface of the magnetic pattern and/or the insulating interlayer 110 may be removed by the rinsing process.

In an implementation, an alcohol-based rinse solution including, e.g., isopropyl alcohol (IPA), may be used for the rinsing process.

In an implementation, a temperature of the alcohol-based rinse solution may be adjusted to be about 20° C. to about 70° C. to improve a rinsing efficiency.

After the rinsing process, a drying process may be further performed on the magnetic pattern using, e.g., nitrogen ($N_2$) gas.

Figure 7:
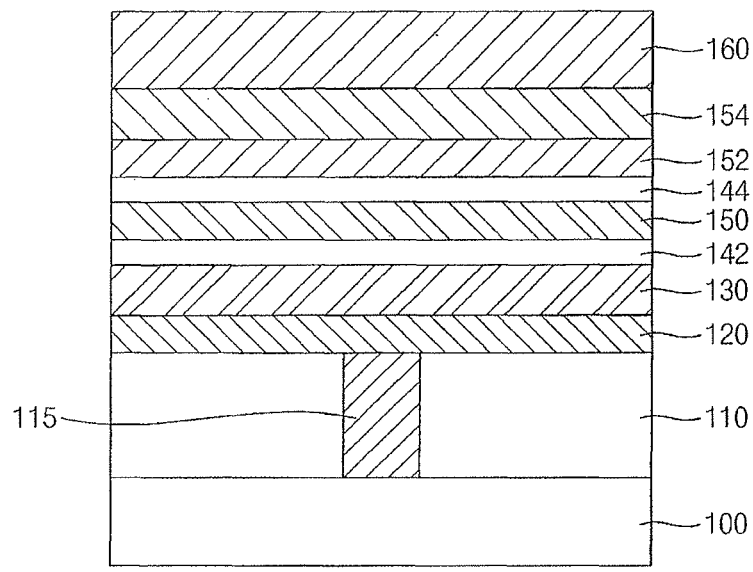
FIGS. 7 to 9 illustrate cross-sectional views of stages in a method of forming a magnetic pattern in accordance with example embodiments.
Figure 8:
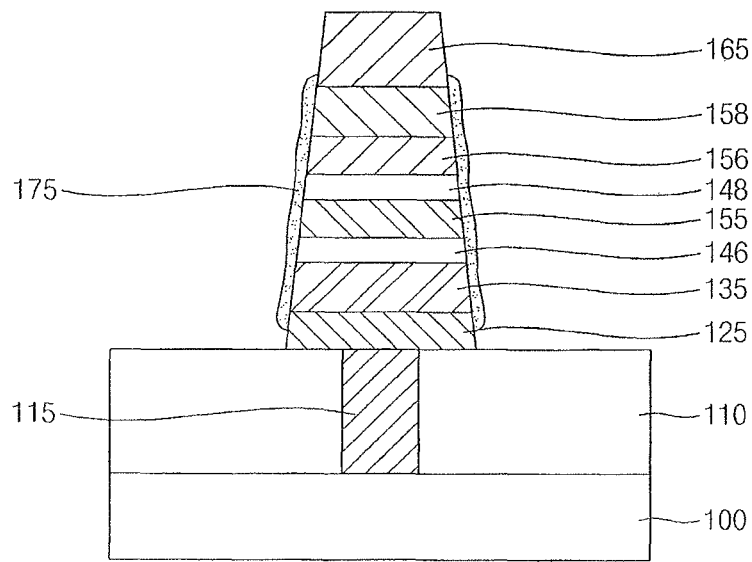
Figure 10:
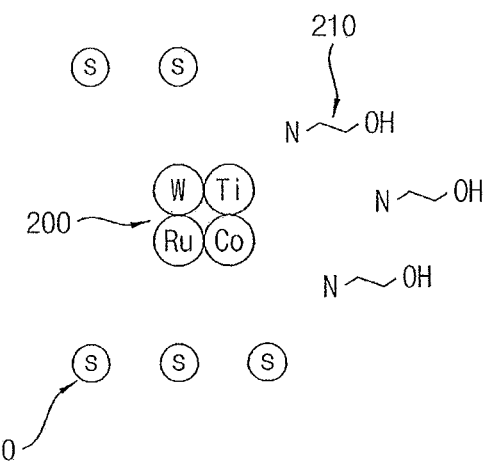
FIGS. 10 to 12 illustrate schematic views of a removal mechanism of a metallic by-product by a cleaning composition in accordance with example embodiments.
Figure 11:
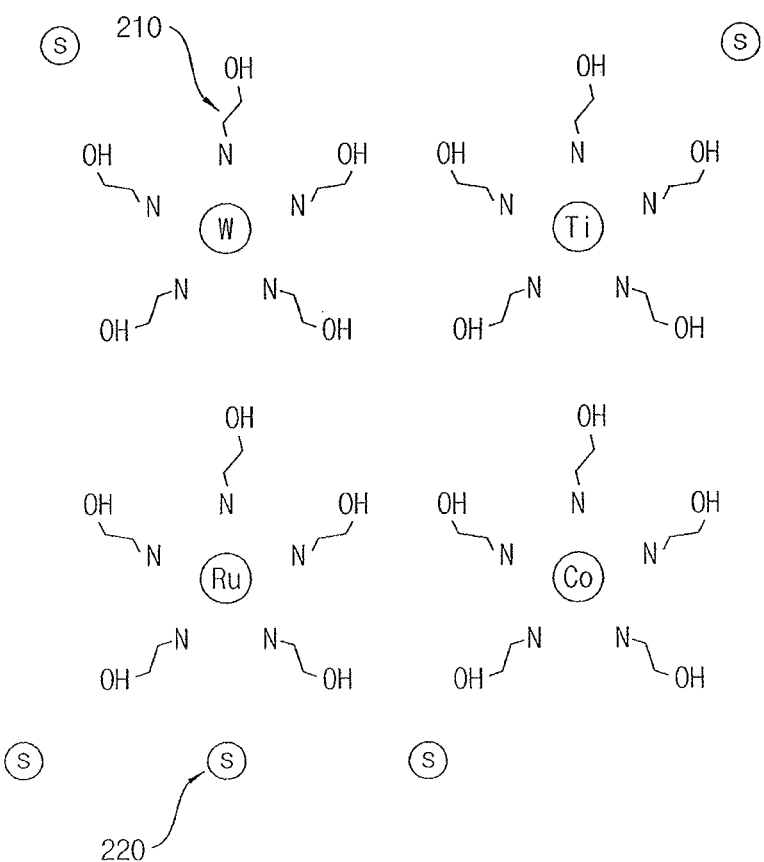
Figure 12:
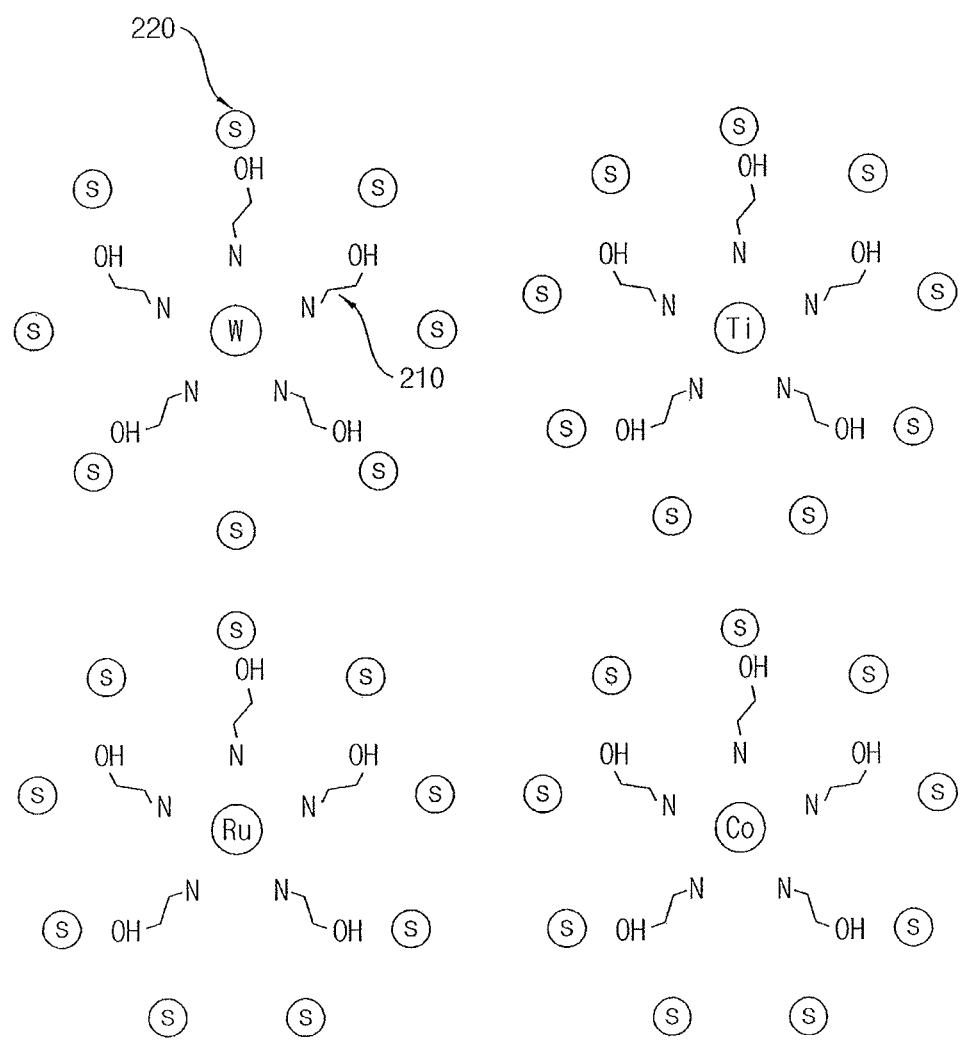

FIGS. 7 and 8 illustrate cross-sectional views of a method of forming a magnetic pattern in accordance with example embodiments. FIGS. 10 to 12 illustrate schematic views showing a removal mechanism of a metallic by-product by a cleaning composition in accordance with example embodiments.

Repeated detailed descriptions on processes and/or materials substantially the same as or similar to those illustrated with reference to FIGS. 1 to 6 may be omitted herein.

Referring to FIG. 7, e.g., an insulating interlayer 110 and a plug 115 may be formed on a substrate 100 by a process substantially the same as or similar to that illustrated with reference to FIG. 1.

Subsequently, a process substantially the same as or similar to that illustrated with reference to FIG. 2 may be performed.

In an implementation, a lower barrier conductive layer 120, a pinned layer 130, a first tunnel barrier layer 142, a free layer 150, a second tunnel barrier layer 144, a spacer layer 152, an upper barrier conductive layer 154, and a metal mask layer 160 may be sequentially formed on the insulating interlayer 110 and the plug 115.

The lower barrier conductive layer 120 and the upper barrier conductive layer 154 may be formed of a metal or a metal nitride, e.g., titanium, titanium nitride, tantalum, tantalum nitride, or the like. In an implementation, the lower barrier conductive layer 120 and the upper barrier conductive layer 154 may be formed of titanium nitride.

As also described with reference to FIG. 2, the pinned layer 130 and the free layer 150 may be formed of a ferromagnetic metal or an alloy thereof. In an implementation, the pinned layer 130 and the free layer 150 may be formed of a boron doped alloy such as CoPtB, CoFeB, FePtB, etc.

The first tunnel barrier layer 142 and the second tunnel barrier layer 144 may be formed of magnesium oxide (MgO) and/or aluminum oxide (AlO). In an implementation, the first tunnel barrier layer 142 may function as a main barrier generating a quantum mechanical tunneling or a spin polarization between the pinned layer 130 and the free layer 150. The second tunnel barrier layer 144 may function as a sub-barrier that may assist the main barrier and strengthen the quantum mechanical tunneling or the spin polarization The spacer layer 152 may be formed of an SAF material such as Ru, Ir, Pd, Os or Rh. In an implementation, the spacer layer 152 may be formed of Ru.

The metal mask layer 160 may be formed of, e.g., W.

The lower barrier conductive layer 120, the pinned layer 130, the first tunnel barrier layer 142, the free layer 150, the second tunnel barrier layer 144, the spacer layer 152, the upper barrier conductive layer 154, and the metal mask layer 160 may be formed by, e.g., a sputtering process or an ALD process.

Referring to FIG. 8, processes substantially the same or similar to those illustrated with reference to FIGS. 3 and 4 may be performed.

In an implementation, the metal mask layer 160 may be patterned to form a metal mask 165, and the layers under the metal mask 165 may be partially removed by a dry etching process using the metal mask 165.

After the etching process, a magnetic pattern including a lower barrier conductive pattern 125, a pinned layer pattern 135, a first tunnel barrier pattern 146, a free layer pattern 155, a second tunnel barrier pattern 148, a spacer 156, an upper barrier conductive pattern 158, and the metal mask 165 may be formed on the plug 115. The magnetic pattern may include an MTJ structure defined by the pinned layer pattern 135, the first tunnel barrier pattern 146, the free layer pattern 155, the second tunnel barrier pattern 148, and the spacer 156.

An etching residue may be generated from at least one layer of the magnetic pattern during the dry etching process to form a metallic by-product 175.

In an implementation, the metallic by-product 175 may include a metal complex from a combination of metallic ingredients detached from the metal mask 165, the barrier conductive patterns 158 and 125, the spacer 156, the pinned layer pattern 135, and/or the free layer pattern 155. In an implementation, the metal complex may include a quaternary complex such as W—Ti—Ru—Co.

In an implementation, the metallic by-product 175, as illustrated in FIG. 8, may be attached to a sidewall of the MTJ structure. In an implementation, the metallic by-product 175 may be also attached to sidewalls of the metal mask 165 and/or the barrier conductive patterns 125 and 158. In an implementation, the metallic by-product 175 may be also attached on a top surface of the insulating interlayer 110.

Figure 9:
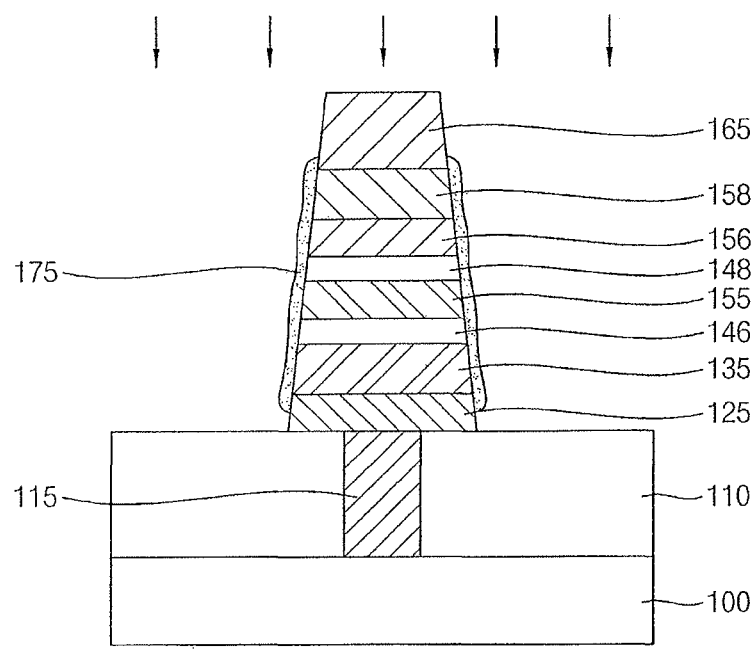

Referring to FIG. 9, a cleaning process may be performed to remove the metallic by-product 175. The cleaning process may be performed using a cleaning composition in accordance with example embodiments as described above.

As described above, the cleaning composition may include a glycol ether-based organic solvent and a decomposing agent including an aliphatic amine. In an implementation, the cleaning composition may further include an organic alkaline cleaning accelerator and/or a chelating agent.

In an implementation, the organic solvent may include diethylene glycol monomethyl ether and/or dipropylene glycol monomethyl ether.

In an implementation, the decomposing agent may include a primary amine and/or an alkanol amine. For example, the decomposing agent may include monoethanol amine and/or isopropanol amine.

The cleaning accelerator may include an organic alkaline compound, e.g., may include a quaternary ammonium hydroxide such as TMAH or choline. The cleaning accelerator may function as a pH adjusting agent of the cleaning composition. The chelating agent may include EDTA.

In an implementation, the cleaning composition may include about 50 wt % to about 95 wt % of the organic solvent, about 4 wt % to about 45 wt % of the decomposing agent, about 0.001 wt % to about 5 wt % of the cleaning accelerator, and about 0.001 wt % to about 5 wt % of the chelating agent, based on a total weight of the cleaning composition.

In an implementation, a passivation layer may be formed on a surface of the metal mask 165 including, e.g., W, by the chelating agent included in the cleaning composition.

Further, an etching rate with respect to the metallic by-product 175 may be increased by the cleaning accelerator included in the cleaning composition so that a cleaning efficiency may be improved. In an implementation, a pH of the cleaning composition may be adjusted to be about 9 to about 12.5 by the cleaning accelerator.

Hereinafter, a removal mechanism of the metal complex will be described in more detail with reference to FIGS. 10 to 12. A metal complex, a decomposing agent, and an organic solvent designated in FIGS. 10 to 12 are exemplarily illustrated, and are not to be construed as limiting.

Referring to FIG. 10, the metallic by-product 175 illustrated in FIG. 9 may include a metal complex 200 having a structure of W—Ti—Ru—Co. For example, the metal complex 200 may be a non-ordered amalgamation of tungsten, titanium, ruthenium, and/or cobalt. For example, monoethanol amine may be used as the decomposing agent of the cleaning composition. Accordingly, an amino group (—NH$_2$) and a hydroxyl group (—OH) may be exposed at terminals of a decomposing agent molecule 210. An organic solvent molecule 220 may be distributed around the metal complex 200 and the decomposing agent molecule 210.

Referring to FIG. 11, while the cleaning composition is provided on the metal complex 200, each metal atom included in the metal complex 200 may be surrounded by the decomposing agent molecules 210. In an implementation, the amino group of the decomposing agent molecule may be coordinated with a surface of each metal atom to form a first assembly. For example, four types of the first assemblies including a first W-assembly, a first Ti-assembly, a first Ru-assembly, and a first Co-assembly may be created from the metal complex 200.

Referring to FIG. 12, each first assembly may be surrounded or captured by the organic solvent molecules 220 to form a second assembly.

In an implementation, the organic solvent molecule 220 may include a glycol ether-based molecule, and thus may interact with the hydroxyl group of the decomposing agent molecule 210 with an improved affinity. For example, a second assembly solvated by the organic solvent molecules 220 may be formed for each metal atom. For example, four types of the second assemblies including a second W-assembly, a second Ti-assembly, a second Ru-assembly, and a second Co-assembly may be created from the metal complex 200.

As described above, the solvated second assemblies may be created for each type of metal atoms based on a capturing mechanism by the cleaning composition. For example, only the undesirable metallic by-product 175 may be removed, without damaging the MTJ structure (e.g., which could otherwise occur due to an oxidation/reduction of components of the MTJ structure).

Subsequently, as described with reference to FIG. 6, a cleaning residue may be additionally rinsed using an alcohol-based rinse solution including, e.g., IPA.

FIGS. 13 to 25 illustrate cross-sectional views of stages in a method of manufacturing a magnetic memory device in accordance with example embodiments. Two directions substantially parallel to a top surface of a substrate and perpendicular to each other are defined as a first direction and a second direction in FIGS. 13 to 25.

Repeated detailed descriptions on processes and/or materials substantially the same as or similar to those illustrated with reference to FIGS. 1 to 6, or FIGS. 7 to 12 may be omitted herein.

Figure 13:
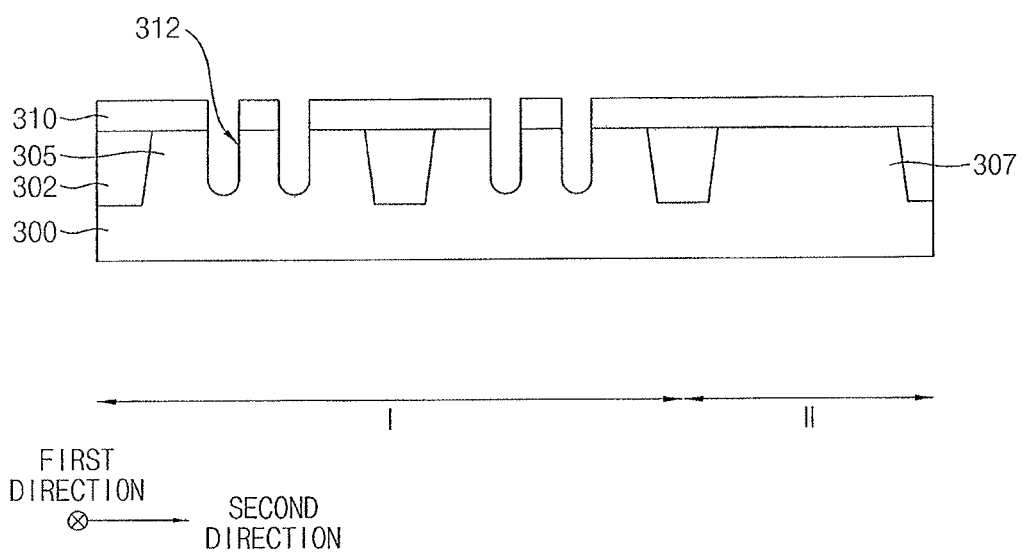
FIGS. 13 to 25 illustrate cross-sectional views of stages in a method of manufacturing a magnetic memory device in accordance with example embodiments.

Referring to FIG. 13, first and second active patterns 305 and 307 may be formed from a substrate 300, and gate trenches 312 may be formed at an upper portion of the first active pattern 305.

The substrate 300 or the magnetic memory device may include a first region I and a second region II. The first region I and the second region II may correspond to a cell region and a peripheral circuit region, respectively.

In an implementation, the first and second active patterns 305 and 307 may be formed by a shallow trench isolation (STI) process. For example, an upper portion of the substrate 300 may be etched to form an isolation trench, and an insulation layer sufficiently filling the isolation trench may be formed. An upper portion of the insulation layer may be planarized by a chemical mechanical polish (CMP) process to form an isolation layer 302 in the isolation trench.

The upper portion of the substrate 300 may be defined by the isolation layer 302 such that the first active pattern 305 and the second active pattern 307 may be formed.

The first active patterns 305 may be formed in the first region I, and may have an island shape buried in the isolation layer 302. The second active pattern 307 may have a plate shape extending in the first direction in the second region II.

A mask pattern 310 partially exposing top surfaces of the first active patterns 305 may be formed on the isolation layer 302. Upper portions of the first active pattern 305 may be etched using the mask pattern 310 to form the gate trenches 312.

In an implementation, two gate trenches 312 may be formed at one first active pattern 305. Each gate trench 312 may extend through an upper portion of the isolation layer 302 and upper portions of a plurality of the first active patterns 305 in the first direction.

The mask pattern 310 may be formed of, e.g., a silicon nitride-based material, a photoresist material or a spin-on hardmask (SOH) material.

Figure 14:
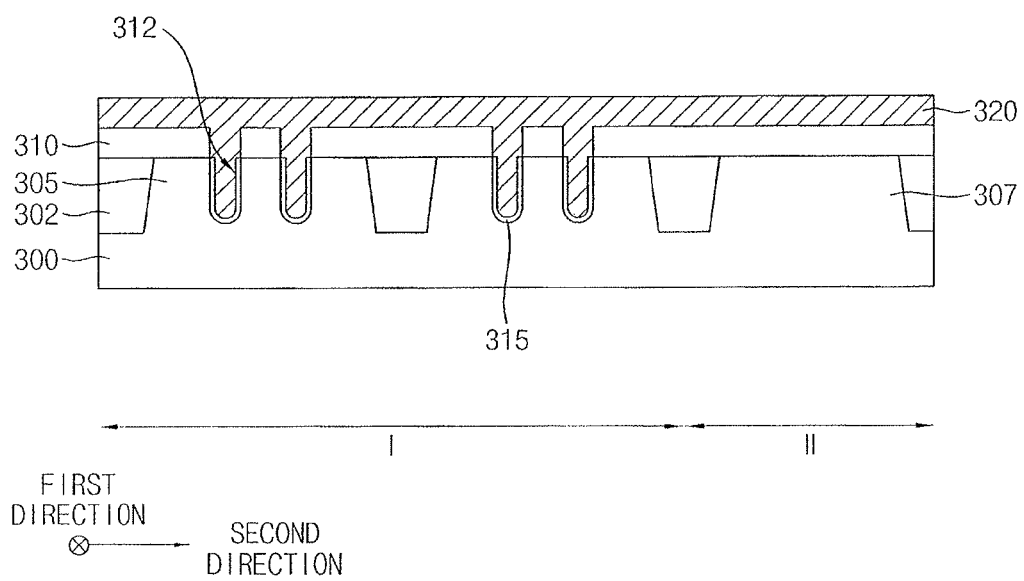

Referring to FIG. 14, a first gate insulation pattern 315 may be formed on an inner wall of the gate trench 312. A first gate electrode layer 320 filling the gate trenches 312 may be formed on the first gate insulation pattern 315 and the mask pattern 310.

In an implementation, the first gate insulation pattern 315 may be formed by performing a thermal oxidation process or a radical oxidation process on a surface of the substrate 300 exposed by the gate trench 312. Alternatively, a first gate insulation layer may be formed by depositing silicon oxide or a metal oxide through, e.g., a CVD process on a surface of the mask pattern 310 and the inner wall of the gate trench 312. An upper portion of the first gate insulation layer may be removed to form the first gate insulation pattern 315.

The first gate electrode layer 320 may be formed of a metal such as Ti, Ta or W, a metal nitride and/or doped polysilicon by, e.g., an ALD process or a physical vapor deposition (PVD) process.

Figure 15:
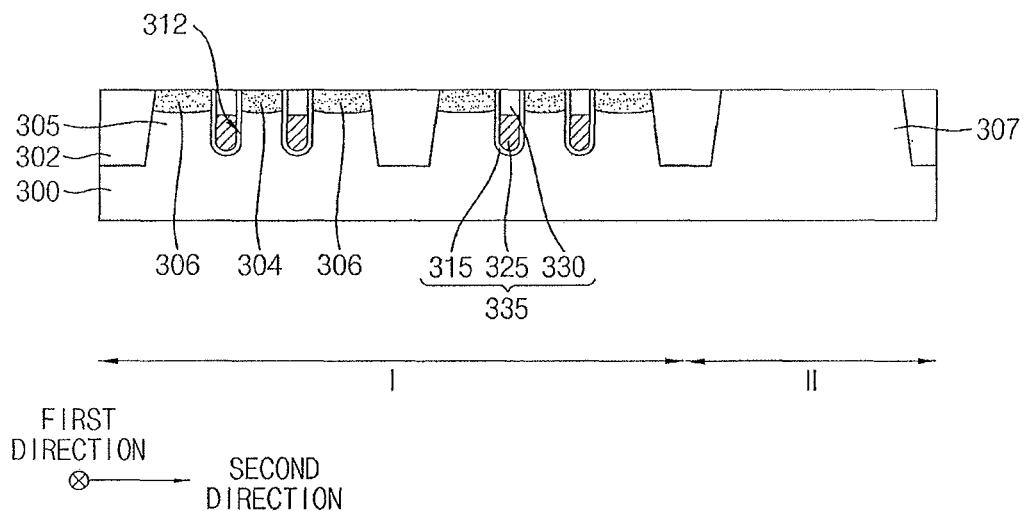

Referring to FIG. 15, a first gate structure 335 may be formed in the gate trench 312, and first and second impurity regions 304 and 306 may be formed at upper portions of the first active patterns 305.

In an implementation, an upper portion of the first gate electrode layer 320 may be planarized by a CMP process until a top surface of the mask pattern 310 may be exposed. Subsequently, an upper portion of the remaining first gate electrode layer 320 may be etched by an etch-back process to form a first gate electrode 325 partially filling the gate trench 312.

A first gate mask layer including, e.g., silicon nitride may be formed on the first gate electrode 325 and the mask pattern 310. The first gate mask layer and the mask pattern 310 may be planarized by a CMP process to form a first gate mask 330 filling a remaining portion of the gate trench 312. As described above, the first gate structure 335 including the first gate insulation pattern 315, the first gate electrode 325 and the first gate mask 330 sequentially formed in the gate trench 312 may be achieved.

The first gate structure 335 may extend in the first direction, and may be buried in the isolation layer 302 and the first active patterns 305 according to a shape of the gate trench 312.

A first ion-implantation mask (not illustrated) covering the second region II may be formed, and impurities may be implanted at the upper portions of the first active patterns 305 adjacent to the first gate structures 335 to form the first and second impurity regions 304 and 306. The first ion-implantation mask may be removed by an ashing process and/or a strip process after forming the first and second impurity regions 304 and 306.

After performing the processes as described above, a BCAT structure defined by the first and second impurity regions 304 and 306, and the first gate structure 335 may be formed at the upper portion of the substrate 300.

Figure 16:
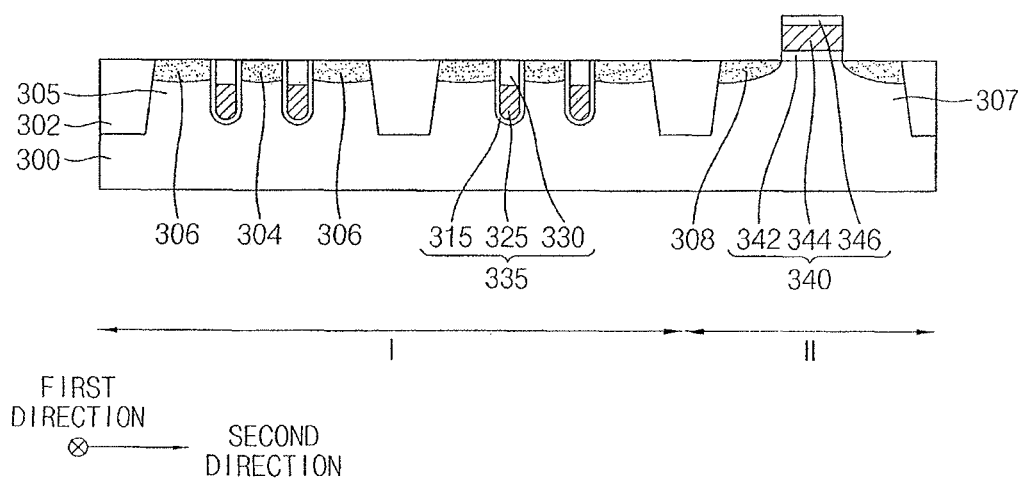

Referring to FIG. 16, a second gate structure 340 and a third impurity region 308 may be formed on the second active pattern 307.

For example, a second gate insulation layer, a second gate electrode layer and a second gate mask layer may be sequentially formed on the first and second active patterns 305 and 307, and the isolation layer 302. The second gate mask layer may be partially etched to form a second gate mask 346, and the second gate electrode layer and the second gate insulation layer may be patterned utilizing the second gate mask 346. Accordingly, the second gate structure 340 including a second gate insulation pattern 342, a second gate electrode 344 and the second gate mask 346 sequentially stacked from a top surface of the second active pattern 307 may be achieved.

A second ion-implantation mask (not illustrated) covering the first region I may be formed, and impurities may be implanted at an upper portion of the second active pattern 307 adjacent to the second gate structure 340 to form the third impurity region 308.

After performing the processes as described above, a peripheral circuit transistor or a logic transistor including the second gate structure 340 and the third impurity region 308 may be formed on the second active pattern 307.

The second gate insulation layer may be formed by a thermal oxidation process or a radical oxidation process on the active patterns 305 and 307, and may include silicon oxide. In an implementation, the second gate insulation layer may be formed by a deposition process, e.g., a CVD process, and may include silicon oxide or a metal oxide.

The second gate electrode layer may be formed of a metal, a metal nitride, a metal silicide and/or doped polysilicon, and the second gate mask layer may be formed of a silicon nitride-based material. The second gate electrode layer and the second gate mask layer may be formed by, e.g., a CVD process, an ALD process or a PVD process.

In an implementation, a mask pattern covering the first region I may be formed before forming the second gate insulation layer. In this case, the second gate insulation layer, the second electrode layer and the second gate mask layer may be formed conformally on surfaces of the mask pattern and the second active pattern 307. The mask pattern may be utilized as the second ion-implantation mask after forming the second gate structure 340. The mask pattern and/or the second ion-implantation mask may be removed by an ashing process and/or a strip process after forming the third impurity region 308.

Figure 17:
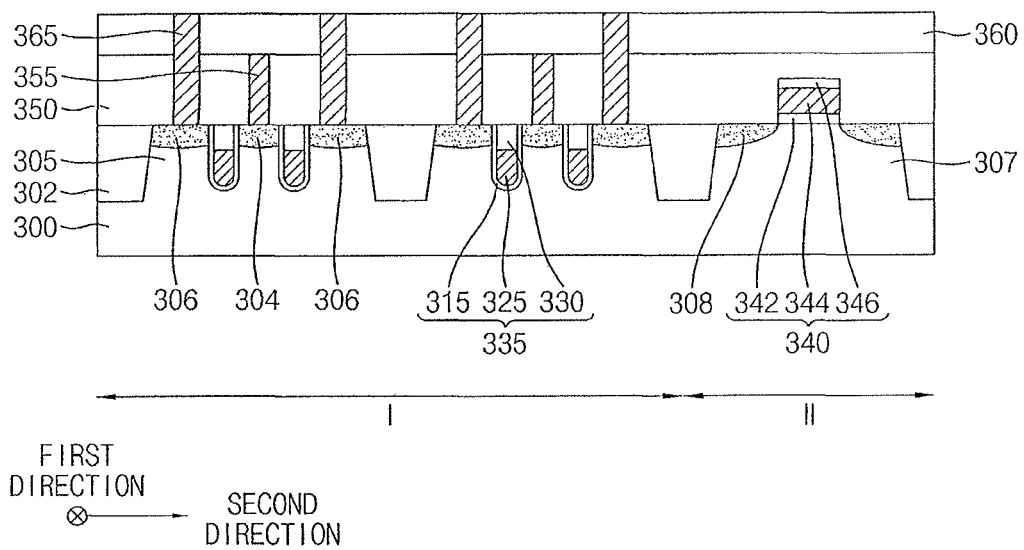

Referring to FIG. 17, a conductive pattern 355 and a first plug 365 electrically connected to the BCAT structure may be formed in the first region I.

For example, a first insulating interlayer 350 covering the BCAT structure may be formed on the first and second active patterns 305 and 307, and the isolation layer 302. The first insulating interlayer 350 may be partially etched to form a first opening through which the first impurity region 304 may be exposed, and a first conductive layer sufficiently filling the first opening may be formed. An upper portion of the first conductive layer may be planarized by, e.g., a CMP process to form the conductive pattern 355.

In an implementation, the conductive pattern 355 may extend in the first direction, and may be electrically connected to a plurality of the first impurity regions 304. In this case, the conductive pattern 355 may serve as a source line.

A second insulating interlayer 360 covering the conductive pattern 355 may be formed on the first insulating interlayer 350. The second and first insulating interlayers 360 and 350 may be partially etched to form first contact holes, each of which may expose the second impurity region 306. A second conductive layer sufficiently filling the first contact holes may be formed, and an upper portion of the second conductive layer may be planarized by a CMP process to form the first plugs 365.

The first and second insulating interlayers 350 and 360 may be formed of silicon oxide by a CVD process or a spin coating process. The first and second conductive layers may be formed of a metal, a metal nitride, a metal silicide and/or doped polysilicon by a sputtering process, a CVD process, or an ALD process.

Figure 18:
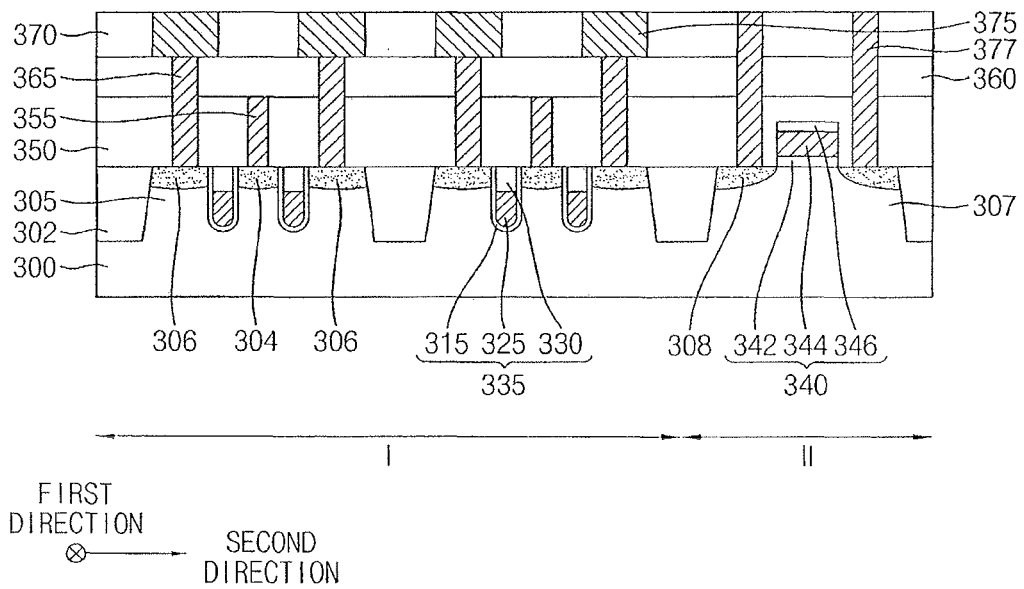

Referring to FIG. 18, a pad 375 being in contact with or electrically connected to the first plug 365 may be formed.

For example, a third insulating interlayer 370 covering the first plugs 365 may be formed on the second insulating interlayer 360. The third insulating interlayer 370 may be formed of a silicon oxide-based material substantially the same as or similar to those of the first and second insulating interlayers 350 and 360.

The third insulating interlayer 370 may be partially removed to form a second opening through which the first plug 365 may be at least partially exposed. A third conductive layer may be formed to sufficiently fill the second opening, and may be planarized by a CMP process to form the pad 375.

In an implementation, the second opening may be formed per each first plug 365. In this case, the pad 375 may be electrically connected to the each first plug 365. In an implementation, the second opening may extend in the first direction to expose a plurality of the first plugs 365. In this case, the pad 375 may extend linearly in the first direction.

The third conductive layer may be formed of a metal, a metal nitride, a metal silicide and/or doped polysilicon by a CVD process, a sputtering process, an ALD process, etc. In some embodiments, the third conductive layer may be formed by a plating process, e.g., a copper electroplating process.

In an implementation, a barrier conductive layer including, e.g., a metal nitride, may be formed on an inner wall of the second opening before forming the third conductive layer.

A second plug 377 electrically connected to the peripheral circuit transistor or the logic transistor formed in the second region II may be formed. For example, the third to first insulating interlayers 370, 360 and 350 may be partially etched to form a third opening through which the third impurity region 308 may be exposed.

A fourth conductive layer sufficiently filling the third opening may be formed, and an upper portion of the fourth conductive layer may be planarized by a CMP process to form the second plug 377. The fourth conductive layer may be formed of a metal, a metal nitride, a metal silicide and/or doped polysilicon by a CVD process, a sputtering process, an ALD process, etc.

Figure 19:
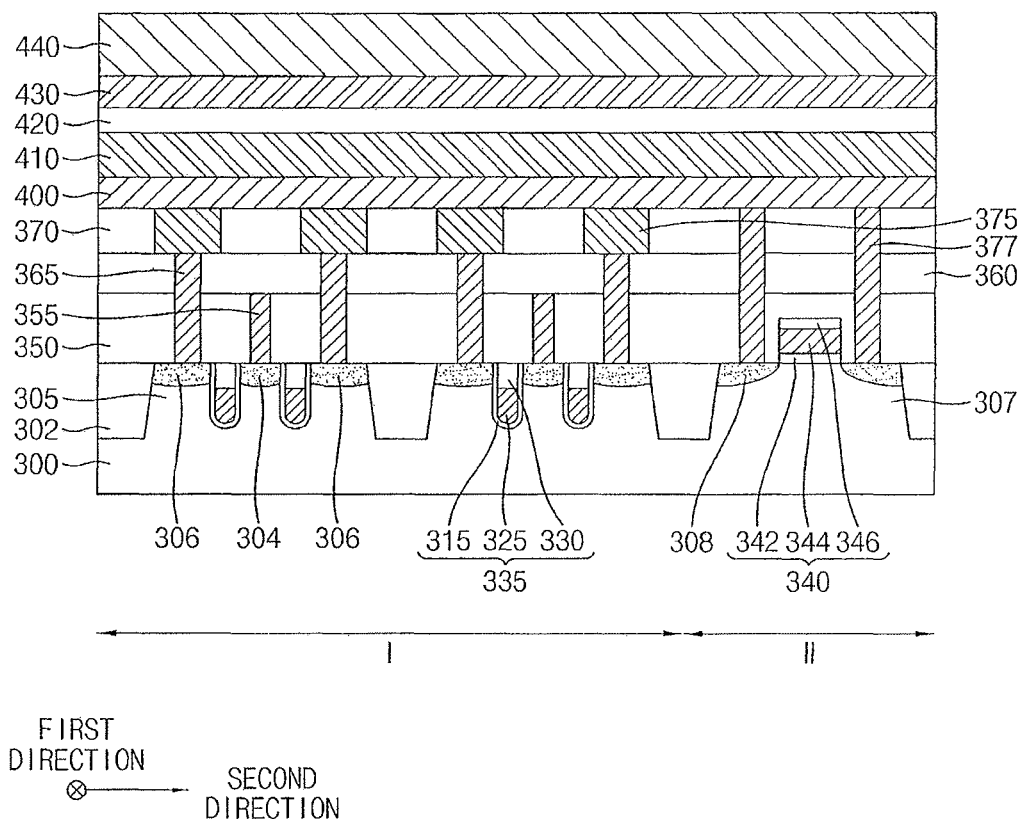

Referring to FIG. 19, a magnetic layer stack structure covering the pads 375 and the second plugs 377 may be formed on the third insulating interlayer 370.

In an implementation, as also described with reference to FIG. 2, a lower barrier conductive layer 400, a first magnetic layer 410, a tunnel barrier layer 420, a second magnetic layer 430 and a metal mask layer 440 may be sequentially formed to form the magnetic layer stack structure. For example, the first magnetic layer 410 and the second magnetic layer 430 may serve as a pinned layer and a free layer, respectively. Alternatively, the first magnetic layer 410 and the second magnetic layer 430 may serve as a free layer and a pinned layer, respectively.

In an implementation, as described with reference to FIG. 7, a lower barrier conductive layer, a first magnetic layer (e.g., a pinned layer), a first tunnel barrier layer, a second magnetic layer (e.g., a free layer), a second tunnel barrier layer, a spacer layer, an upper barrier conductive layer and a metal mask layer may be sequentially formed to form the magnetic layer stack structure.

Figure 20:
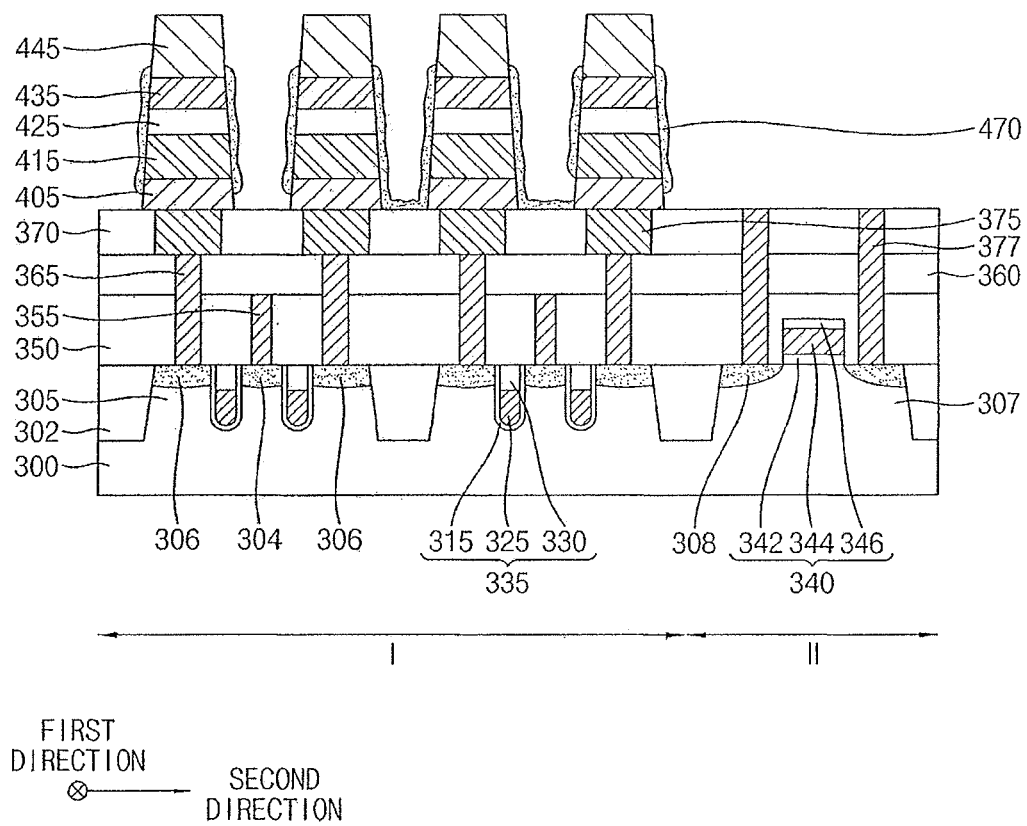

Referring to FIG. 20, as also described with reference to FIGS. 3 and 4, or FIG. 8, the magnetic layer stack structure may be partially etched to form magnetic patterns on the first region I.

The magnetic pattern may include a lower barrier conductive pattern 405, a first magnetic layer pattern 415 (e.g., a pinned layer pattern), a tunnel barrier pattern 425, a second magnetic layer pattern 435 (e.g., a free layer pattern), and a metal mask 445 sequentially stacked on the pad 375. An MTJ structure may be defined by the first magnetic pattern 415, the tunnel barrier pattern 425, and the second magnetic pattern 435 included in the magnetic pattern.

The lower barrier conductive pattern 405 and the metal mask 445 may serve as a lower electrode and an upper electrode, respectively, connected to the MTJ structure.

In an implementation, as illustrated in FIG. 8, the magnetic pattern may include a lower barrier conductive pattern, a first magnetic layer pattern (e.g., a pinned layer pattern), a first tunnel barrier pattern, a second magnetic layer pattern (e.g., a free layer pattern), a second tunnel barrier pattern, a spacer, an upper barrier conductive pattern, and a metal mask sequentially stacked on the pad 375. The magnetic pattern may include an MTJ structure defined by the first magnetic layer pattern, the first tunnel barrier pattern, the second magnetic layer pattern, the second tunnel barrier pattern, and the spacer.

As illustrated in FIG. 20, a metallic by-product 470 may be attached on a sidewall of the magnetic pattern during a dry etching process for forming the magnetic pattern. The metallic by-product 470 may include a metal complex, e.g., a ternary complex or a quaternary complex as illustrated in FIG. 10.

In an implementation, the metallic by-product 470 may be also formed on the third insulating interlayer 370 and/or may extend along sidewalls of the magnetic patterns neighboring each other.

Figure 21:
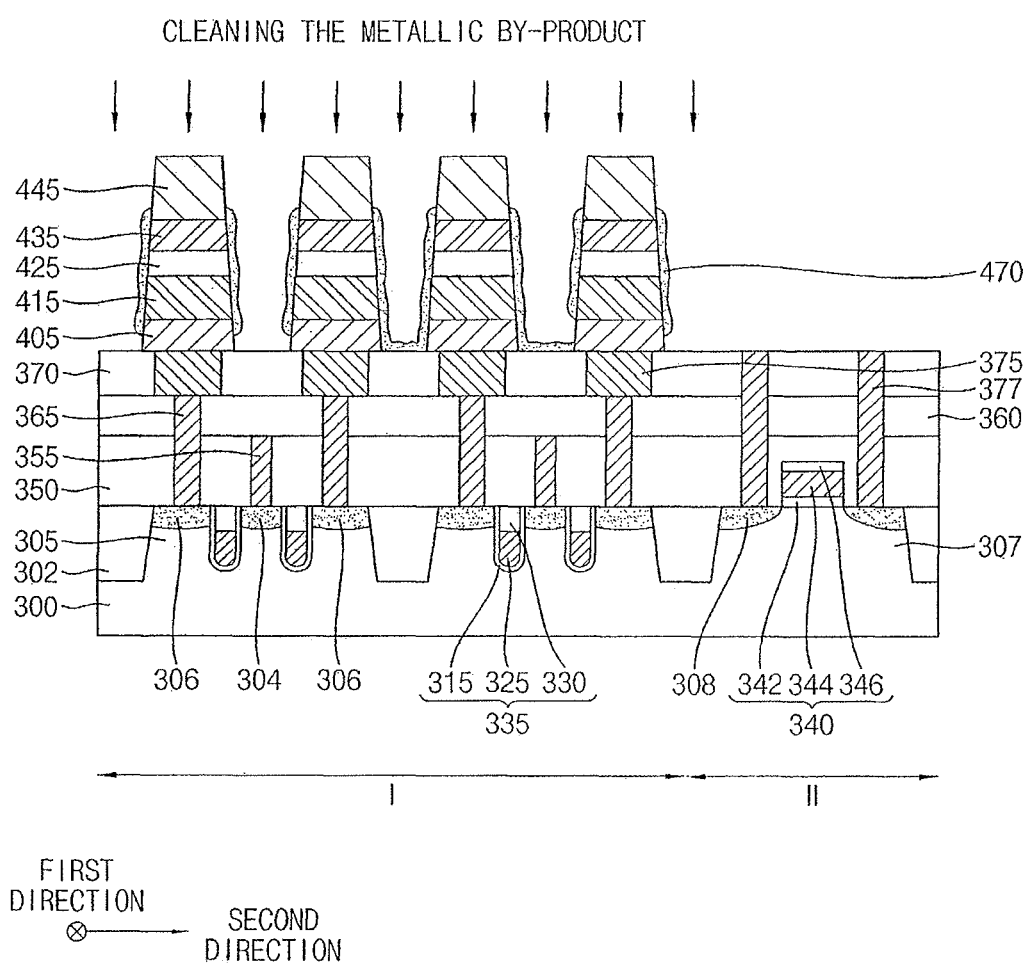

Referring to FIG. 21, as also described with reference to FIG. 5 or FIG. 9, a cleaning process may be performed to remove the metallic by-product 470. The cleaning process may be performed using a cleaning composition in accordance with example embodiments as described above.

As described above, the cleaning composition may include a glycol ether-based organic solvent and a decomposing agent including an aliphatic amine. In an implementation, the cleaning composition may further include an organic alkaline cleaning accelerator and/or a chelating agent.

In an implementation, the organic solvent may include diethylene glycol monomethyl ether and/or dipropylene glycol monomethyl ether.

In an implementation, the decomposing agent may include a primary amine and/or an alkanol amine. For example, the decomposing agent may include monoethanol amine and/or isopropanol amine.

The cleaning accelerator may include an organic alkaline compound, in some embodiments, may include a quaternary ammonium hydroxide such as TMAH or choline. The cleaning accelerator may function as a pH adjusting agent of the cleaning composition. The chelating agent may include EDTA.

In an implementation, the cleaning composition may include about 50 wt % to about 95 wt % of the organic solvent, about 4 wt % to about 45 wt % of the decomposing agent, about 0.001 wt % to about 5 wt % of the cleaning accelerator, and about 0.001 wt % to about 5 wt % of the chelating agent, based on a total weight of the cleaning composition.

The metallic by-product 470 may be removed by the cleaning composition according to, e.g., a mechanism as described with reference to FIGS. 10 to 12.

An organic-based cleaning system substantially devoid of water may be realized by the cleaning composition. For example, the metallic by-product 470 may be selectively removed without damaging the magnetic patterns (e.g., which could otherwise be caused by water and/or strong acidic or strong basic conditions). Further, damage to the third insulating interlayer 370 (including an inorganic insulative material) may also be reduced and/or prevented during the cleaning process.

In an implementation, removal efficiency may be improved by the cleaning accelerator, and undesirable generation of metal residues from the metal mask 445 may be suppressed by the chelating agent.

Figure 22:
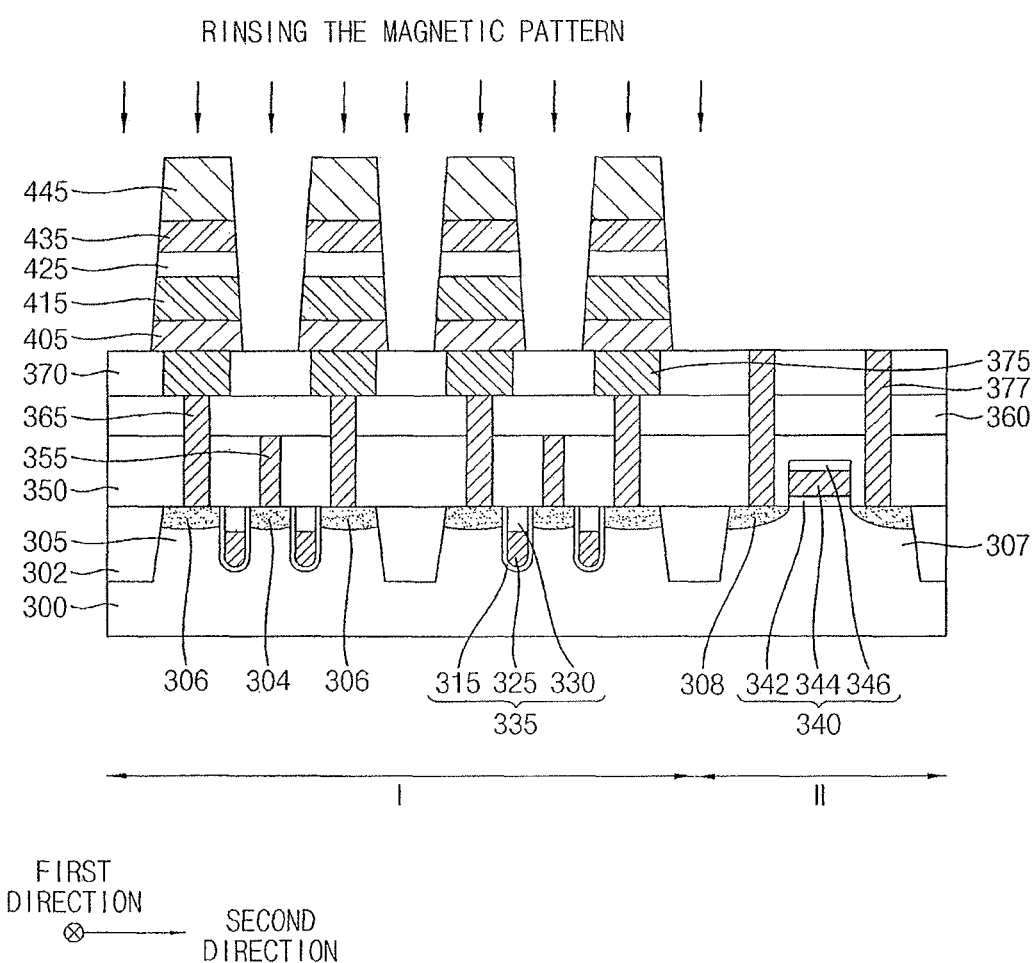

Referring to FIG. 22, as also described with reference to FIG. 6, a rinsing process may be performed to remove a cleaning residue remaining on the surface of the magnetic pattern, the third insulating interlayer 370, and/or the second plug 377.

An alcohol-based rinse solution including, e.g., IPA, may be used in the rinsing process.

Figure 23:
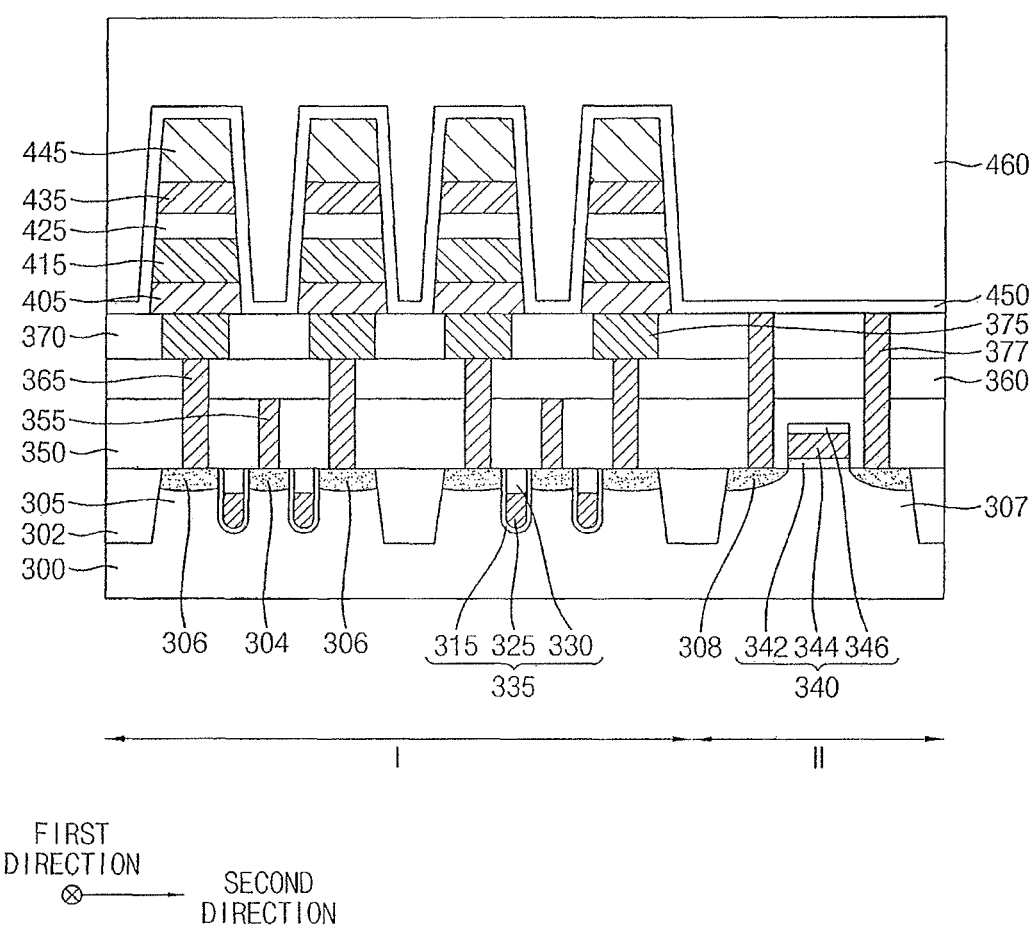

Referring to FIG. 23, a passivation layer 450 may be formed along a top surface of the third insulating interlayer 370 and surfaces of the magnetic patterns.

For example, the passivation layer 450 may be formed of silicon nitride or silicon oxynitride by an ALD process.

An upper insulation layer 460 covering the magnetic patterns may be formed on the passivation layer 450. The upper insulation layer 460 may be formed of a silicon oxide-based material substantially the same as or similar to those of the first to third insulating interlayers 350, 360 and 370 by a CVD process or a spin coating process.

Figure 24:
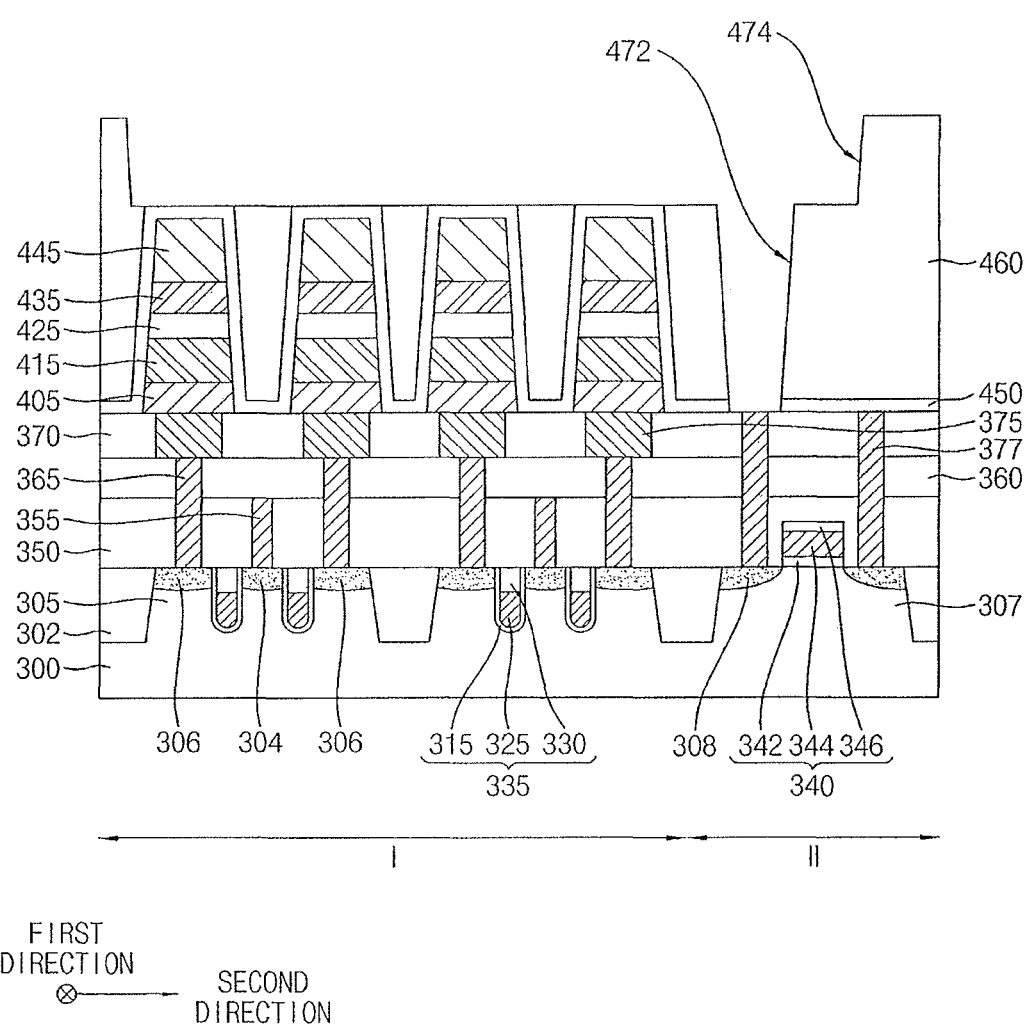

Referring to FIG. 24, a via hole 472 may be formed by etching portions of the upper insulation layer 460 and the passivation layer 450 formed in the second region II. In example embodiments, a top surface of the second plug 377 may be at least partially exposed through the via hole 472.

Subsequently, an upper portion of the upper insulation layer 460 and an upper portion of the passivation layer 450 in the first region I may be partially removed to form a trench 474 connected to the via hole 472. Top surfaces of the metal masks 445 may be exposed by a bottom of the trench 474.

Figure 25:
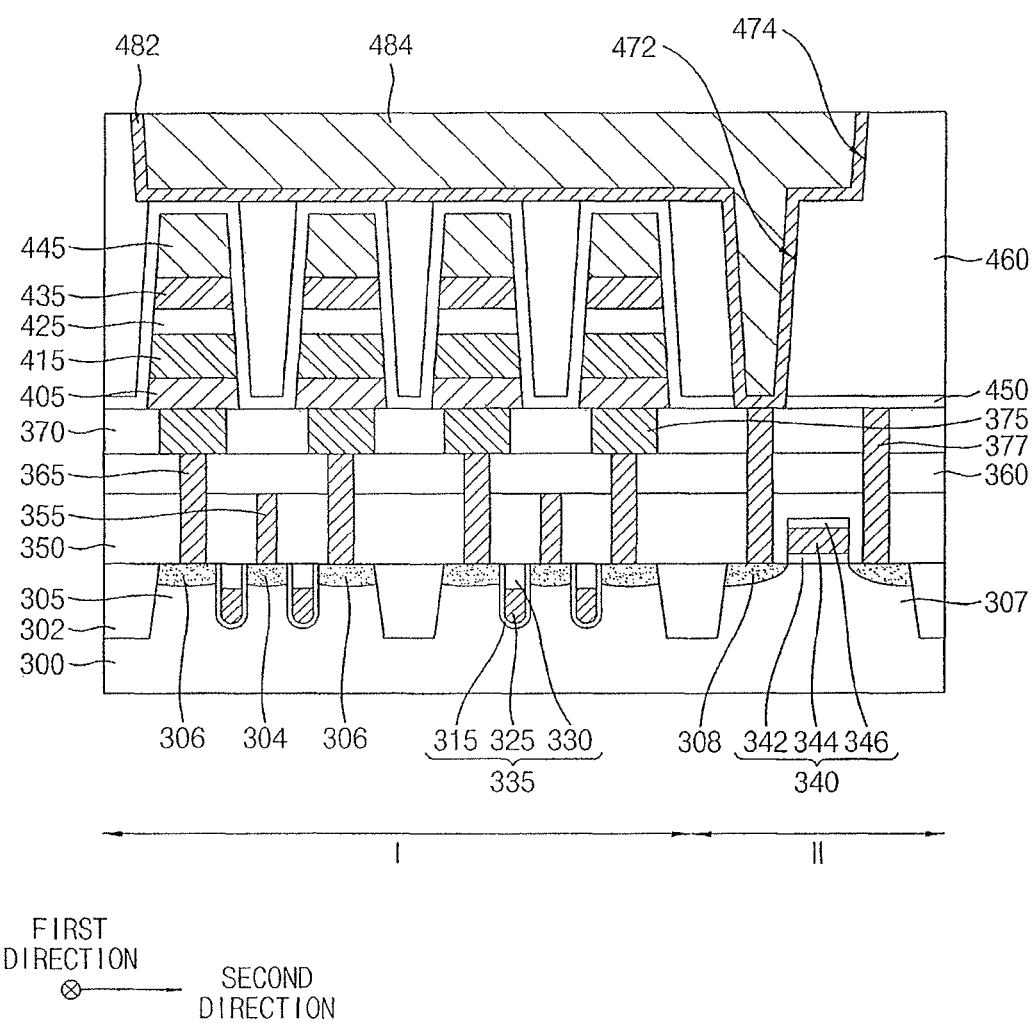

Referring to FIG. 25, a conductive line filling the via hole 472 and the trench 474 may be formed.

In an implementation, a barrier layer may be formed conformally along inner walls of the via hole 472 and the trench 474, and a metal filling layer sufficiently filling the via hole 472 and the trench 474 may be formed on the barrier layer. Upper portions of the barrier layer and the metal filling layer may be planarized by a CMP process to form the conductive line including a barrier pattern 482 and a metal filling pattern 484.

In an implementation, the barrier layer may be formed of a metal such as Ti, Ta, Ru, etc., or a nitride of the metal by a sputtering process or a CVD process. The metal filling layer may be formed by a plating process, e.g., a copper electroplating process. For example, a copper seed layer may be formed on the barrier later, and the metal filling layer may be formed by the copper electroplating process.

A portion of the conductive line formed in the trench 474 may extend in the second direction, and may serve as, e.g., a bit line of the magnetic memory device. A portion of the conductive line formed in the via hole 472 may be electrically connected to the second plug 377, and may serve as a via structure transferring an electrical signal from the peripheral circuit transistor or the logic transistor.

Hereinafter, properties of the cleaning composition in accordance with example embodiments will be described in more detail with reference to Experimental Examples. However, it will be understood that the Experimental Examples are not to be construed as limiting the scope of the embodiments.

Experimental Example

Preparing Cleaning Compositions of Examples and Comparative Examples

Compositions for cleaning magnetic patterns were prepared by using components and amounts provided in Table 1, below. The amounts in Table 1 refer to weight percent (wt %) based on a total weight of each composition.

TABLE 1

|  | Organic Solvent | Decomposing Agent | Cleaning Accelerator | Chelating Agent | Other Components |
|---|---|---|---|---|---|
| Example 1 | MDG 55% | MEA 45% | — | | |
| Example 2 | MDG 95% | MEA 5% | — | | |
| Example 3 | MFDG 70% | AIP 30% | — | | |

TABLE 1-continued

| | Organic Solvent | Decomposing Agent | Cleaning Accelerator | Chelating Agent | Other Components |
|---|---|---|---|---|---|
| Example 4 | MFDG 75% | MEA 25% | — | | |
| Example 5 | MFDG 74% | MEA 25% | Choline 1% | | |
| Example 6 | MFDG 94% | MEA 5% | Choline 1% | | |
| Example 7 | MFDG 94.7% | MEA 5% | TMAH 0.3% | | |
| Example 8 | MFDG 90% | MEA 5% | — | EDA 5% | |
| Example 9 | MFDG 75% | MEA 24.95% | — | EDTA 0.05% | |
| Example 10 | MFDG 94% | MEA 5% | TMAH 0.5% | EDTA 0.5% | |
| Comparative Example 1 | MFDG 100% | — | — | — | |
| Comparative Example 2 | MDG 100% | — | — | — | |
| Comparative Example 3 | — | MEA 100% | — | — | |
| Comparative Example 4 | MDG 10% | MEA 90% | — | — | |
| Comparative Example 5 | MFDG 92% | MEA 5% | — | — | Acetic Acid 3% |
| Comparative Example 6 | MTG 60% | AIP 40% | — | — | |

The components used in the cleaning composition are provided in Table 2, below.

TABLE 2

| | Descriptions of Components |
|---|---|
| MDG | diethylene glycol monomethyl ether |
| MFDG | dipropylene glycol monomethyl ether |
| EDA | ethylene diamine |
| AIP | isopropanol amine |
| MEA | monoethanol amine |
| Choline | 1-hydroxyethyl trimethyl ammonium hydroxide |
| TMAH | tetramethyl ammonium hydroxide |
| MTG | triethylene glycol monomethyl ether |
| EDTA | ethylene diamine tetraacetic acid |

Evaluations on a Metallic by-Product Etching Efficiency

Tungsten bare wafers were prepared, and then immersed in the cleaning compositions of Examples and Comparative Examples listed in Table 1 at 50° C. for 30 minutes. Thicknesses of the tungsten bare wafers before and after the cleaning process were measured using an energy dispersive-X-ray fluorescence (ED-XRF) apparatus to evaluate etching rates with respect to metallic by-products including W.

In Table 3 below, the etching rates were categorized and represented using symbols as follows:
1) ⊚: greater than 5 Å/min
2) ○: 1 Å/min~5 Å/min
3) Δ: 0.5~1 Å/min
4) X: less than 0.5 Å/min Evaluation of Damage to Magnetic Patterns A Ru layer, a MgO layer, a CoFeB layer, and a W layer were sequentially formed on a silicon (Si) wafer to form a magnetic layer stack structure. The magnetic layer stack structure was immersed in the cleaning compositions of Examples and Comparative Examples listed in Table 1 for a day at 60° C. Damage to the MgO and CoFeB layers included in the magnetic layer stack structure were observed using a field emission scanning electron microscope (FE-SEM).

In Table 3 below, "X" represents that damage was not observed in the magnetic layer stack structure, and "○" represents that damage was observed in the magnetic layer stack structure

TABLE 3

| | Metallic By-product Etching Efficiency | MgO Damage | CoFeB Damage |
|---|---|---|---|
| Example 1 | ○ | X | X |
| Example 2 | ○ | X | X |
| Example 3 | ○ | X | X |
| Example 4 | ○ | X | X |
| Example 5 | ⊚ | X | X |
| Example 6 | ⊚ | X | X |
| Example 7 | ⊚ | X | X |
| Example 8 | ⊚ | X | X |
| Example 9 | ⊚ | X | X |
| Example 10 | ⊚ | X | X |
| Comparative Example 1 | X | X | X |
| Comparative Example 2 | X | X | X |
| Comparative Example 3 | Δ | X | X |
| Comparative Example 4 | Δ | X | X |
| Comparative Example 5 | ○ | ○ | X |
| Comparative Example 6 | — | — | ○ |

Referring to Table 3, when the compositions of Examples 1-10 were used, improved metallic by-product etching efficiencies were obtained, and the damages of the MgO layer and the CoFeB layer were not observed. For example, in the compositions of Examples 5 to 7 (including the cleaning accelerator) and the compositions of Examples 8 and 9 (including the chelating agent), more improved etching efficiencies (greater than 5 Å/min) were achieved.

The composition of Example 10 including both the chelating agent and the cleaning accelerator had a pH of 12.2, showed the greatest etching rate, and did not cause damage to the MgO and CoFeB layers.

In the compositions of Comparative Examples 1 to 3 (having a single component of the organic solvent or the decomposing agent), effective or significant metallic by-product etching rates were not achieved. In the composition of Comparative Example 4 (devoid of the cleaning accelerator or the chelating agent), damage to the MgO and CoFeB layers were not observed, however, effective metallic by-product etching rates were not also achieved.

In the composition of Comparative Example 5 (further including aqueous acetic acid), the effective metallic by-product etching rate was obtained, however, the MgO layer was damaged due to an addition of a water-based component. In the composition of Comparative Example 6 (including MTG as the organic solvent), the CoFeB layer was damaged.

According to example embodiments, a composition for cleaning magnetic patterns may include glycol ether and an aliphatic amine, and may further include an organic alkaline agent and/or a chelating agent. The composition may be an organic-based composition substantially devoid of water so that an etching residue may be selectively removed by the composition while suppressing damages of a tunnel barrier layer, a metal layer, a magnetic layer, etc., included in the magnetic pattern. Further, a removal rate of the etching residue may be controlled by the organic alkaline agent, and, e.g., a sidewall of a metal mask may be protected by the chelating agent.

By way of summation and review, various etching residues may be generated from an etching process, and a cleaning process may be performed to remove the etching residues. While performing the cleaning process, other structures of the magnetic memory device may be damaged together with the etching residues.

The embodiments may provide organic-based compositions for cleaning magnetic patterns, and methods of forming magnetic patterns and manufacturing magnetic memory devices using the same.

The embodiments may provide a composition for cleaning magnetic patterns having improved cleaning reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for cleaning a magnetic pattern, the composition comprising:
   a glycol ether-based organic solvent;
   about 4 weight percent to about 45 weight percent of a decomposing agent that includes an aliphatic amine, the weight percent being based on a total weight of the composition; and
   at least one of:
   a chelating agent, or
   a cleaning accelerator that includes an organic alkaline compound,
   wherein the composition is devoid of water,
   wherein the composition has a pH of about 9 to about 12.5.

2. The composition as claimed in claim 1, wherein the glycol ether-based organic solvent includes diethylene glycol monomethyl ether, triethylene glycol monobutyl ether, ethylene glycol monohexyl ether, diethylene glycol monohexyl ether, diethylene glycol monophenyl ether, propylene glycol monomethyl ether, dipropylene glycol monomethyl ether, tripropylene glycol monomethyl ether, dipropylene glycol monopropyl ether, propylene glycol monobutyl ether, or dipropylene glycol monobutyl ether.

3. The composition claim 2, wherein the organic solvent includes at least one of diethylene glycol monomethyl ether or dipropylene glycol monomethyl ether.

4. The composition as claimed in claim 1, wherein the decomposing agent includes at least one of a primary amine or an alkanol amine.

5. The composition as claimed in claim 4, wherein the decomposing agent includes at least one of monoethanol amine or isopropanol amine.

6. The composition as claimed in claim 1, wherein:
   the composition includes the cleaning accelerator, and
   the cleaning accelerator includes a quaternary ammonium hydroxide.

7. The composition as claimed in claim 6, wherein:
   the composition includes the cleaning accelerator, and
   the cleaning accelerator includes tetramethyl ammonium hydroxide or choline.

8. The composition as claimed in claim 1, wherein:
   the composition includes the chelating agent, and
   the chelating agent includes ethylene diamine, diethylene triamine, triethylene tetramine, tetraethylene pentamine, or ethylenediamine tetraacetic acid.

9. The composition as claimed in claim 1, wherein the composition is used for removing a metal complex formed by a combination of at least one ferromagnetic metal and at least one non-ferromagnetic metal.

10. The composition as claimed in claim 9, wherein the aliphatic amine of the decomposing agent is capable of being coordinated with the metal complex.

11. A composition for cleaning a magnetic pattern, the composition comprising:
    about 50 weight percent to about 95 weight percent of a glycol ether-based organic solvent;
    about 4 weight percent to about 45 weight percent of a decomposing agent that includes an aliphatic amine;
    about 0.001 weight percent to about 5 weight percent of a cleaning accelerator that includes an organic alkaline compound; and
    about 0.001 weight percent to about 5 weight percent of a chelating agent, all weight percent being based on a total weight of the composition,
    wherein the composition has a pH of about 9 to about 12.5.

12. The composition as claimed in claim 11, wherein:
    the organic solvent includes at least one of diethylene glycol monomethyl ether or dipropylene glycol monomethyl ether, and
    the decomposing agent includes at least one of a primary amine or an alkanol amine.

13. The composition as claimed in claim 11, wherein the cleaning accelerator includes a quaternary ammonium hydroxide.

14. The composition as claimed in claim 11, wherein the chelating agent includes ethylenediamine tetraacetic acid.

15. The composition as claimed in claim 11, wherein the composition is devoid of water.

16. A composition for cleaning a magnetic pattern, the composition consisting essentially of:
    a glycol ether-based organic solvent;
    an aliphatic amine; and
    at least one of:
    a chelating agent, or
    an organic alkaline compound,
    wherein the composition has a pH of about 9 to about 12.5.

17. The composition as claimed in claim 16, wherein the glycol ether-based organic solvent includes diethylene glycol monomethyl ether, triethylene glycol monobutyl ether, ethylene glycol monohexyl ether, diethylene glycol monohexyl ether, diethylene glycol monophenyl ether, propylene glycol monomethyl ether, dipropylene glycol monomethyl ether, tripropylene glycol monomethyl ether, dipropylene glycol monopropyl ether, propylene glycol monobutyl ether, or dipropylene glycol monobutyl ether.

18. The composition claim 17, wherein the organic solvent includes at least one of diethylene glycol monomethyl ether or dipropylene glycol monomethyl ether.

19. The composition as claimed in claim 16, wherein the aliphatic amine includes at least one of a primary amine or an alkanol amine.

20. The composition as claimed in claim 19, wherein the aliphatic amine includes at least one of monoethanol amine or isopropanol amine.

* * * * *